United States Patent
Dow et al.

(10) Patent No.: US 11,075,650 B1
(45) Date of Patent: *Jul. 27, 2021

(54) SUB-MATRIX REDUCTION FOR QUASI-CYCLIC LDPC CODES

(71) Applicant: Xilinx, Inc., San Jose, CA (US)

(72) Inventors: Andrew Dow, Edinburgh (GB); Richard L. Walke, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/666,599

(22) Filed: Oct. 29, 2019

(51) Int. Cl.
*H03M 13/00* (2006.01)
*H03M 13/11* (2006.01)
*H03M 13/07* (2006.01)

(52) U.S. Cl.
CPC ......... *H03M 13/116* (2013.01); *H03M 13/07* (2013.01); *H03M 13/1105* (2013.01); *H03M 13/1177* (2013.01); *H03M 13/1182* (2013.01)

(58) Field of Classification Search
None
See application file for complete search history.

(56) References Cited

U.S. PATENT DOCUMENTS

| 10,727,869 | B1 * | 7/2020 | Walke | H03M 13/1111 |
| 2015/0058692 | A1 * | 2/2015 | Bennatan | H03M 13/1131 714/752 |
| 2015/0188578 | A1 * | 7/2015 | Sugihara | H03M 13/611 714/752 |

* cited by examiner

*Primary Examiner* — Guerrier Merant
(74) *Attorney, Agent, or Firm* — Patterson + Sheridan, LLP

(57) ABSTRACT

A decoder circuit includes an input to receive a first codeword encoded based on a quasi-cyclic low-density parity-check (QC LDPC) code. The first codeword includes a sequence of data arranged according to an order of columns in a first parity-check matrix associated with the QC LDPC code. A codeword reordering stage generates a reordered codeword by changing the sequence of the data in the first codeword based at least in part on a size of one or more circulant submatrices in the first parity-check matrix. An LDPC decoder generates a decoded codeword by decoding the reordered codeword based on a second parity-check matrix associated with the QC LDPC code. In some implementations, the second parity-check matrix may comprise a plurality of second circulant submatrices of a different size than the first circulant submatrices.

20 Claims, 24 Drawing Sheets

200B

P=10

| 0 | 1 | 0 | 0 | 0 | 0 | 0 | 0 | 0 | 0 | ← p=1 |
|---|---|---|---|---|---|---|---|---|---|---|
| 0 | 0 | 1 | 0 | 0 | 0 | 0 | 0 | 0 | 0 | ← p=2 |
| 0 | 0 | 0 | 1 | 0 | 0 | 0 | 0 | 0 | 0 | ← p=3 |
| 0 | 0 | 0 | 0 | 1 | 0 | 0 | 0 | 0 | 0 | ← p=4 |
| 0 | 0 | 0 | 0 | 0 | 1 | 0 | 0 | 0 | 0 | ← p=5 |
| 0 | 0 | 0 | 0 | 0 | 0 | 1 | 0 | 0 | 0 | ← p=6 |
| 0 | 0 | 0 | 0 | 0 | 0 | 0 | 1 | 0 | 0 | ← p=7 |
| 0 | 0 | 0 | 0 | 0 | 0 | 0 | 0 | 1 | 0 | ← p=8 |
| 0 | 0 | 0 | 0 | 0 | 0 | 0 | 0 | 0 | 1 | ← p=9 |
| 1 | 0 | 0 | 0 | 0 | 0 | 0 | 0 | 0 | 0 | ← p=10 |

```
1     for b = 1:B
2        for p = 1:P
3           for l = 1:L_b
4              v_{l,p}^b = v_{l,p}^b - upd\_vnode_{l,p}^b
5           end
6           for l = 1:L_b
7              upd\_vnode_{l,p}^b = α min(|V_{l,p}^b|) ∏ sign(V_{l,p}^b)
8           end
9           for l = 1:L_b
10             v_{l,p}^b = v_{l,p}^b + upd\_vnode_{l,p}^b
11          end
12       end
13    end
```

| | Cycle 1 | Cycle 2 | Cycle 3 |
|---|---|---|---|
| RP 901 | 702 | 712 | 722 |
| RP 902 | | | |
| RP 903 | | | |
| RP 904 | 704 | 714 | 724 |
| RP 905 | | | |
| RP 906 | | | |
| RP 907 | 706 | 716 | 726 |
| RP 908 | | | |
| RP 909 | | | |
| RP 910 | 708 | 718 | 728 |
| RP 911 | | | |
| RP 912 | | | |

LDPC Decoder 900

100% Utilization

FIG. 9

| LDPC Decoder 1000 | Cycle 1 | Cycle 2 | Cycle 3 | Cycle 4 | Cycle 5 | Cycle 6 |
|---|---|---|---|---|---|---|
| RP 1001 | | | | | | |
| RP 1002 | 702 | 706 | 712 | 716 | 722 | 726 |
| RP 1003 | | | | | | |
| RP 1004 | 704 | 708 | 714 | 718 | 724 | 728 |
| RP 1005 | | | | | | |
| RP 1006 | | | | | | |
| RP 1007 | | | | | | |
| RP 1008 | | | | | | |

75% Utilization

FIG. 10

SUB-MATRIX REDUCTION FOR QUASI-CYCLIC LDPC CODES

TECHNICAL FIELD

Aspects of the present disclosure generally relate to integrated circuits, and specifically to low-density parity-check (LDPC) codes.

BACKGROUND

Low-density parity-check (LDPC) codes are a class of error-correcting codes that may be efficiently encoded and decoded in hardware. LDPC codes are linear codes that have sparse parity-check matrices. The sparseness of the parity-check matrices allows for relatively fast decoding and computationally inexpensive error correction. Many practical LDPC code designs use quasi-cyclic (QC) LDPC codes to yield more efficient hardware parallelization. Layered decoding is an efficient way of decoding LDPC codes and is commonly used in a wide range of applications. More specifically, layered decoding offers multiple opportunities for parallel implementation. For example, an LDPC decoder implementing layered decoding may be capable of processing multiple rows of a parity-check matrix in a single cycle. However, the number of decoding processes that can be performed in parallel may depend on the design or configuration of the QC LDPC code. Accordingly, it may be desirable to optimize the number of parallel decoding operations that can be performed by an LDPC decoder for a given QC LDPC code.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to low-density parity-check (LDPC) decoders and methods of their operation. An example decoding system may include a first codeword reordering stage and an LDPC decoder. An input to the decoding system may receive a first codeword encoded based on a quasi-cyclic low-density parity-check (QC LDPC) code. The first codeword includes a sequence of data arranged according to an order of columns in a first parity-check matrix associated with the QC LDPC code. The first codeword reordering stage may generate a reordered codeword by changing the sequence of data in the first codeword based at least in part on a size (P) of one or more first circulant submatrices in the first parity-check matrix. The LDPC decoder may generate a decoded codeword by decoding the reordered codeword based on a second parity-check matrix associated with the QC LDPC code. In some implementations, the decoding system may further include a second codeword reordering stage to output the decoded codeword based on the order of the columns in the first parity-check matrix.

The LDPC decoder may comprise a number (M) of row processors and may be configured to process at most M orthogonal vectors concurrently, where M is not an integer multiple of P. The second parity-check matrix may comprise a plurality of second circulant submatrices of a different size (P') than the first circulant submatrices. For example, P may be an integer (f) multiple of P'. In some implementations, P is greater than M whereas P' is less than or equal to M. In some other implementations, M is an integer (k) multiple of P'. Thus, the LDPC decoder may be configured to process k*P' second circulant matrices. The second circulant submatrices may be generated by reordering the columns and rows of the first parity-check matrix. In some implementations, the first codeword reordering stage may change the sequence of the data in the first codeword based on the reordering of the columns of the first parity-check matrix.

An example method disclosed herein may be used to decode QC LDPC codewords. The method may include steps of receiving a first codeword encoded based on a QC LDPC code, where the first codeword includes a sequence of data arranged according to an order of columns in a first parity-check matrix associated with the QC LDPC code; generating a reordered codeword by changing the sequence of the data in the first codeword based at least in part on a size (P) of one or more first circulant submatrices in the first parity-check matrix; and decoding the reordered codeword based on a second parity-check matrix associated with the QC LDPC code. In some implementations, the method may further include a step of outputting the decoded codeword based on the order of the columns in the first parity-check matrix.

The decoding may be performed by an LDPC decoder comprising a number (M) of row processors and configured to process at most M orthogonal vectors concurrently, where M is not an integer multiple of P. The second parity-check matrix may comprise a plurality of second circulant submatrices of a different size (P') than the first circulant submatrices. For example, P may be an integer (f) multiple of P'. In some implementations, P is greater than M whereas P' is less than or equal to M. In some other implementations, M is an integer multiple (k) of P'. Thus, the step of decoding may include a step of processing k*P' second circulant submatrices of the second parity-check matrix concurrently. In some implementations, the method may further include a step of generating the second circulant submatrices by reordering the columns and rows of the first parity-check matrix. Further, the step of generating the reordered codeword may include a step of changing the sequence of the data in the first codeword based on the reordering of the columns of the first parity-check matrix.

An example method disclosed herein may be used to encode QC LDPC codewords. The method may include steps of receiving a sequence of information bits arranged according to an order of columns in a first parity-check matrix associated with a quasi-cyclic (QC) low-density parity-check (LDPC) code, reordering the information bits based at least in part on a size (P) of one or more first circulant submatrices in the first parity-check matrix, and encoding the reordered information bits as an LDPC codeword based on a second parity-check matrix associated with the QC LDPC code. The second parity-check matrix may comprise a plurality of second circulant submatrices of a different size (P') than the first circulant submatrices, where P is an integer multiple of P'. In some implementations, the method may further include a step of outputting the LDPC codeword based on the order of the columns in the first parity-check matrix.

BRIEF DESCRIPTION OF THE DRAWINGS

The example embodiments are illustrated by way of example and are not intended to be limited by the figures of the accompanying drawings. Like numbers reference like elements throughout the drawings and specification.

FIG. 2B shows an example circulant submatrix for an LDPC code, in accordance with some embodiments.

FIG. 4A shows an example layered decoding operation, in accordance with some embodiments.

FIG. 5A shows an example parity-check matrix for an LDPC code, in accordance with some embodiments.

FIG. 5B shows an example LDPC decoder, in accordance with some embodiments.

FIG. 8B shows another example row permutation of the parity-check matrix depicted in FIG. 5A.

FIG. 9 shows another example LDPC decoder, in accordance with some embodiments.

FIG. 10 shows another example LDPC decoder, in accordance with some embodiments.

DETAILED DESCRIPTION

Figure 1:
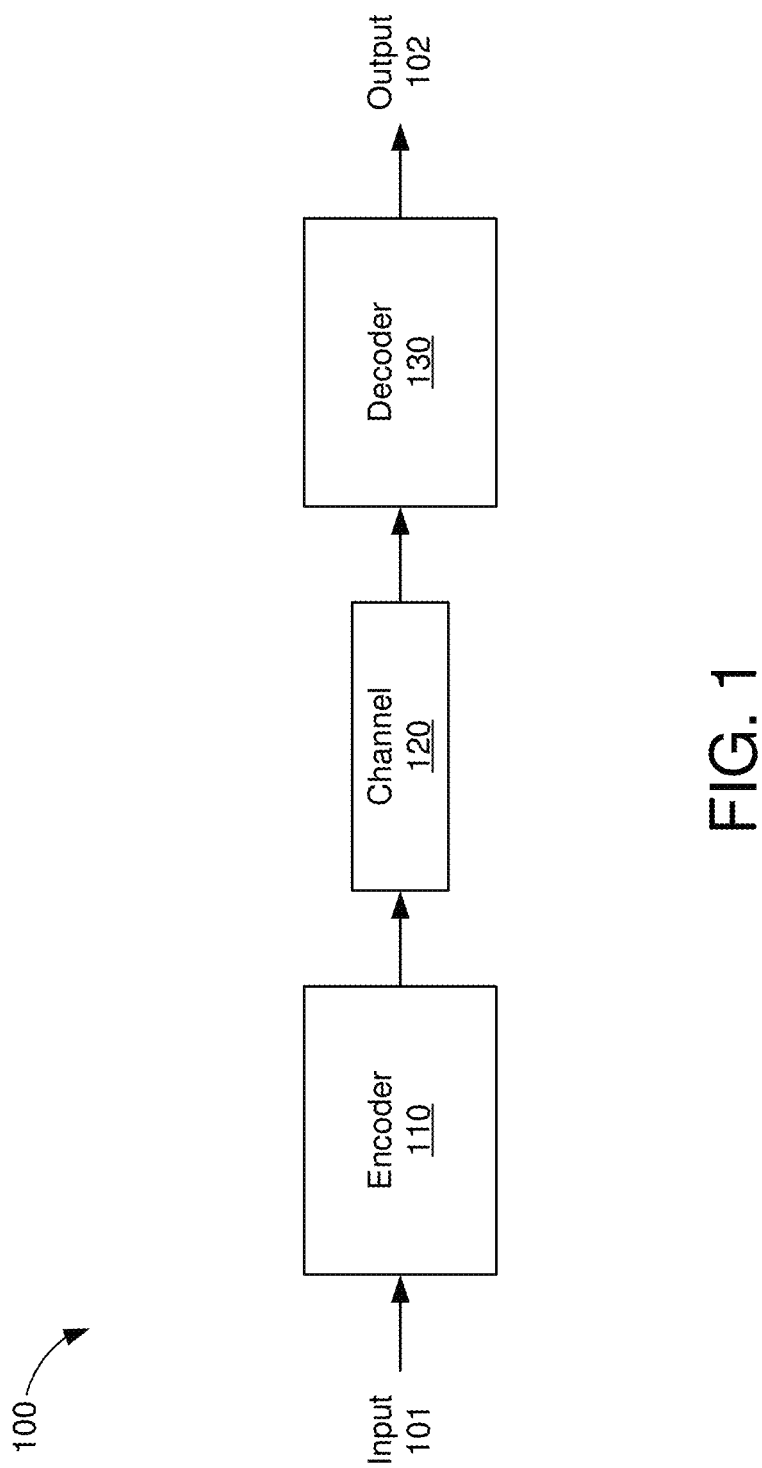
FIG. 1 is a block diagram of an example communication system, in accordance with some embodiments.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Low-density parity-check (LDPC) codes are widely used in many communication standards. Some LDPC codes may use quasi-cyclic parity-check matrices for improved bit error rate. Such codes may be referred to as quasi-cyclic low-density parity-check (QC LDPC) codes. A parity-check matrix for a QC LDPC code may be represented by a base matrix and expansion submatrices for expanding the elements of the base matrix. Some LDPC decoders may use a layered approach to decoding QC LDPC codes, for example, by updating soft bit information from layer to layer of the parity-check matrix. Each layer corresponds to a row of the base matrix, which may include multiple rows of an expansion submatrix. Each submatrix of a parity-check matrix may correspond to an all-zero matrix or a circulant matrix having a circulant weight equal to or greater than one. For a circulant submatrix with a circulant weight of one, each row and column of the circulant submatrix may contain only one non-zero element. Thus, multiple rows of the circulant submatrix may be processed in parallel (or simultaneously) by an LDPC decoder.

Although an LDPC decoder may be capable of processing multiple rows of a circulant submatrix in a single cycle, the number of cycles needed to process an entire layer of the base matrix (which may include multiple circulant submatrices) may depend on the hardware resources of the decoder and/or the design or configuration of the LDPC code. For example, an LDPC decoder with a number (M) of row processors may be capable of processing up to M orthogonal vectors (e.g., rows of a parity-check matrix) concurrently or in parallel. Thus, the efficiency of the LDPC decoder may depend on the size of the circulant submatrices in the base matrix. For example, an LDPC decoder with 12 row processors (M=12) may operate with 100% efficiency when processing circulant submatrices of size P=12. In other words, because there are no dependencies between the rows of a circulant submatrix, the LDPC decoder may utilize all 12 processors to process all 12 rows of the circulant submatrix concurrently (e.g., in a single cycle). However, when the number of row processors in the LDPC decoder is not an integer multiple of the submatrix size (such as where M is less than P or M is a non-integer multiple of P), the LDPC decoder may operate with sub-optimal efficiency. For example, when processing circulant submatrices of size P=9, the LDPC decoder may operate at only 75% efficiency since the LDPC decoder may be unable to pack more than one circulant submatrix of size P=9 into the 12 available row processors in each processing cycle, leaving 3 processors out of 12 unused.

Aspects of the present disclosure may improve the performance of a decoding system by reducing the size of the submatrices in a way that increases the number of parallel decoding operations that may be performed by an LDPC decoder. In addition, or in the alternative, some aspects disclosed herein may be used to increase the range of submatrix sizes (e.g., where P>M) that can be supported by the LDPC decoder. In some embodiments, the decoding system may reorder the columns and/or rows of an original parity-check matrix, which comprises circulant submatrices of a first size (P), to produce a modified parity-check matrix comprising circulant submatrices of a second size (P'). In some aspects, the decoding system may reduce the size of the submatrices in the modified parity-check matrix (e.g., P'<P) such that P is an integer multiple (f) of P'. This matrix modification may allow the LDPC decoder to pack in more circulant submatrices into each processing cycle, thereby improving the efficiency of the LDPC decoder.

In some aspects, as a result of the submatrix size reduction, M may also be an integer multiple (k) of P'. The LDPC decoder may concurrently process k circulant submatrices of size P', thereby utilizing 100% of the available processing resources during each processing cycle. In some other aspects, P may be greater than M. When P is greater than M, the LDPC decoder may be unable to process the original parity-check matrix (e.g., without additional circuitry and/or modifications). However, as a result of the submatrix size reduction, P' may be less than or equal to M, thereby allowing the LDPC decoder to process the modified parity-check matrix using its existing hardware (e.g., without any additional circuitry and/or modifications).

In some embodiments, the decoding system may include a codeword reordering stage to change the sequence of data in a received codeword prior to the decoding. More specifically, the sequence of data in the received codeword may be arranged according to an order of the columns in the original parity-check matrix. Since the columns of the original parity-check matrix are reordered to produce the modified parity-check matrix, the codeword reordering stage may reorder the sequence of data in the received codeword to ensure proper alignment between the codeword data and the columns of the modified parity-check matrix. In other words, the changes to the sequence of data in the codeword may track the changes to the order of columns in the parity-check matrix. In some embodiments, the decoding system may include an additional codeword reordering stage to change the sequence of data in the decoded codeword generated by the LDPC decoder. More specifically, the additional codeword reordering stage may output the data from the decoded codeword according to the order of columns in the original parity-check matrix.

Although particular systems and methods are described herein for maximizing the number of parallel decoding operations that may be performed by an LDPC decoder, the embodiments disclosed herein can also be used to improve the efficiency of LDPC encoding operations with little or no modification. For example, aspects of the present disclosure recognize that encoding operations may be performed (e.g., using a back-substitution process) with the same parity-check matrix (or at least a modified form of the parity-check matrix) used for decoding QC LDPC codes. Accordingly, the methods disclosed herein for reducing the size of circulant submatrices, by reordering the columns and/or rows of a parity-check matrix, may also be used to maximize the number of parallel encoding operations that may be performed by an LDPC encoder.

FIG. 1 is a block diagram of an example communication system 100, in accordance with some embodiments. The communication system includes an encoder 110, a channel 120, and decoder 130. The encoder 110 and decoder 130 may be provided in respective communication devices such as, for example, computers, switches, routers, hubs, gateways, or other devices capable of transmitting and/or receiving communication signals. The channel 120 may be a wired or wireless communication link between the encoder 110 and the decoder 130.

The encoder 110 may receive an input 101 comprising message data to be transmitted to the decoder 130 via the channel 120. However, imperfections in the channel 120 may introduce channel distortion (e.g., linear distortion, multi-path effects, Additive White Gaussian Noise (AWGN), and/or other signal impairments). Thus, the encoder 110 may encode the input 101 prior to transmission. In some embodiments, the encoder 110 may encode the input 101 in accordance with an LDPC code so that error correction may be performed at the decoder 130. For example, the encoder 110 may generate an LDPC codeword as a result of the encoding. The LDPC codeword may be transmitted, over the channel 120, to the decoder 130. Upon receiving the LDPC codeword, the decoder 130 may use a parity-check matrix associated with the LDPC code to decode the received codeword. More specifically, the decoded codeword may be provided as an output 102 to the decoder 130. If channel 120 introduces errors (e.g., flipped bits) into the transmitted codeword, the decoder 130 may detect and correct such errors using the parity-check matrix.

Figure 2A:
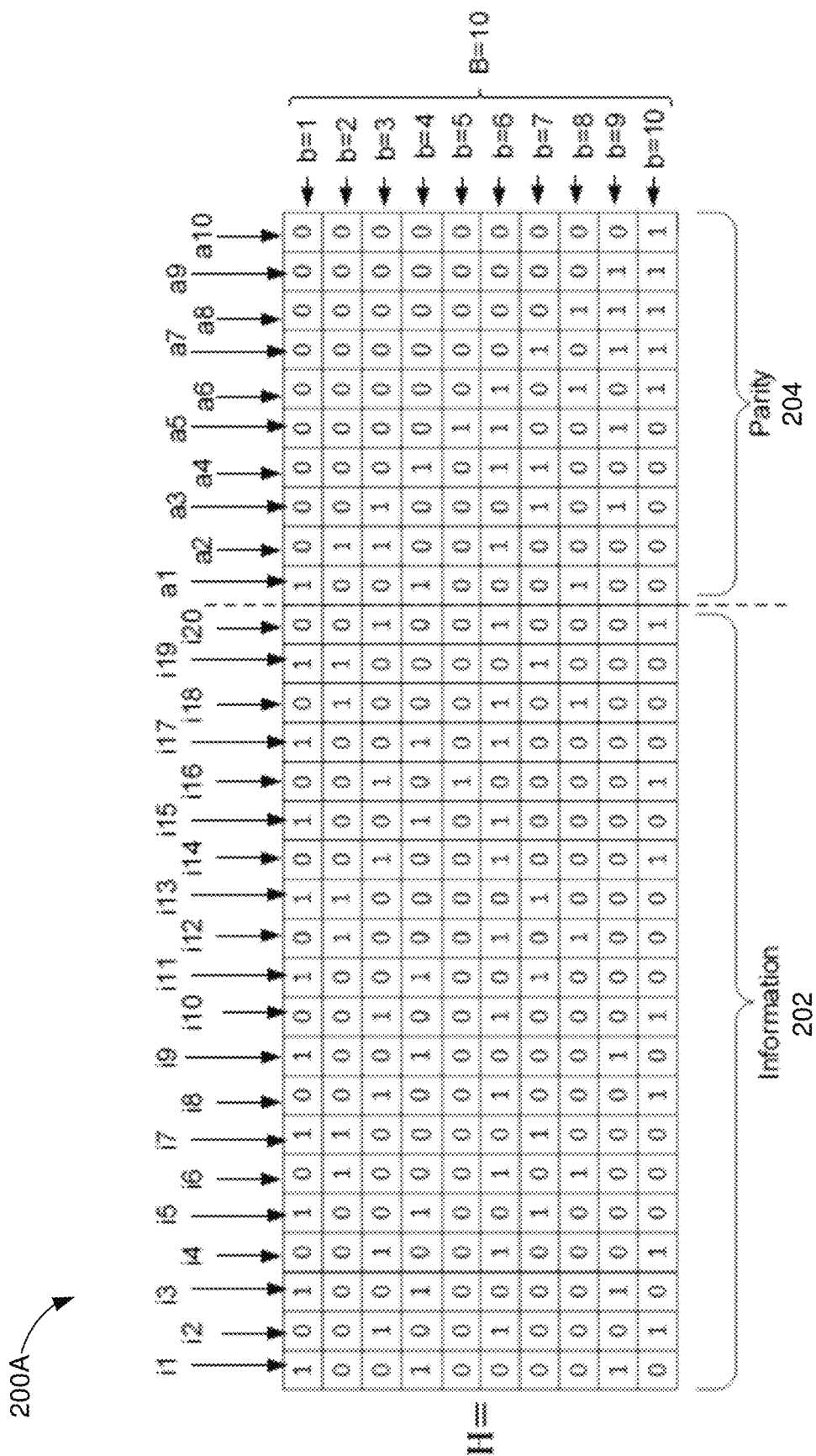
FIG. 2A shows an example parity-check matrix for a low-density parity-check (LDPC) code, in accordance with some embodiments.

FIG. 2A shows an example parity-check matrix 200A for a low-density parity-check (LDPC) code, in accordance with some embodiments. The parity check matrix 200A includes an information part 202 and a parity part 204. The information part 202 of the parity check matrix 200A includes information bits (e.g., information bits i1 through i20 for each row). The parity part 204 of the parity check matrix 200A includes parity bits (e.g., parity bits a1 through a10 for each row). With reference to FIG. 1, the parity-check matrix 200A may be used by the encoder 110 to encode an input 101 comprising 20 information bits to 30 codeword bits, for example, by adding 10 parity bits to the information bits. The decoder 130 may determine that a received codeword (c) is a valid codeword if the following condition is satisfied: $Hc^T=0$, where H represents the parity-check matrix 200A.

In some embodiments, the parity-check matrix 200A may correspond to a base matrix of a quasi-cyclic (QC) LDPC code. Each row of the base matrix may be referred to as a "layer," and may be assigned a particular layer index (b) based on the total number (B) of layers in the base matrix. In the example of FIG. 2A, the base matrix 200A is shown to have a total of 10 layers (e.g., B=10). Within a given layer, each column of the base matrix 200A (e.g., i1 through i20) may comprise a submatrix. For example, each "0" in the parity-check matrix 200A may be expanded to an all-zero submatrix, and each "1" in the parity-check matrix 200A may be expanded to a circulant matrix having a circulant weight equal to or greater than 1. With reference for example to FIG. 2B, a circulant submatrix 200B is shown having a circulant weight equal to 1. Thus, each row and column of the circulant submatrix 200B contains only one non-zero element.

Figure 3:
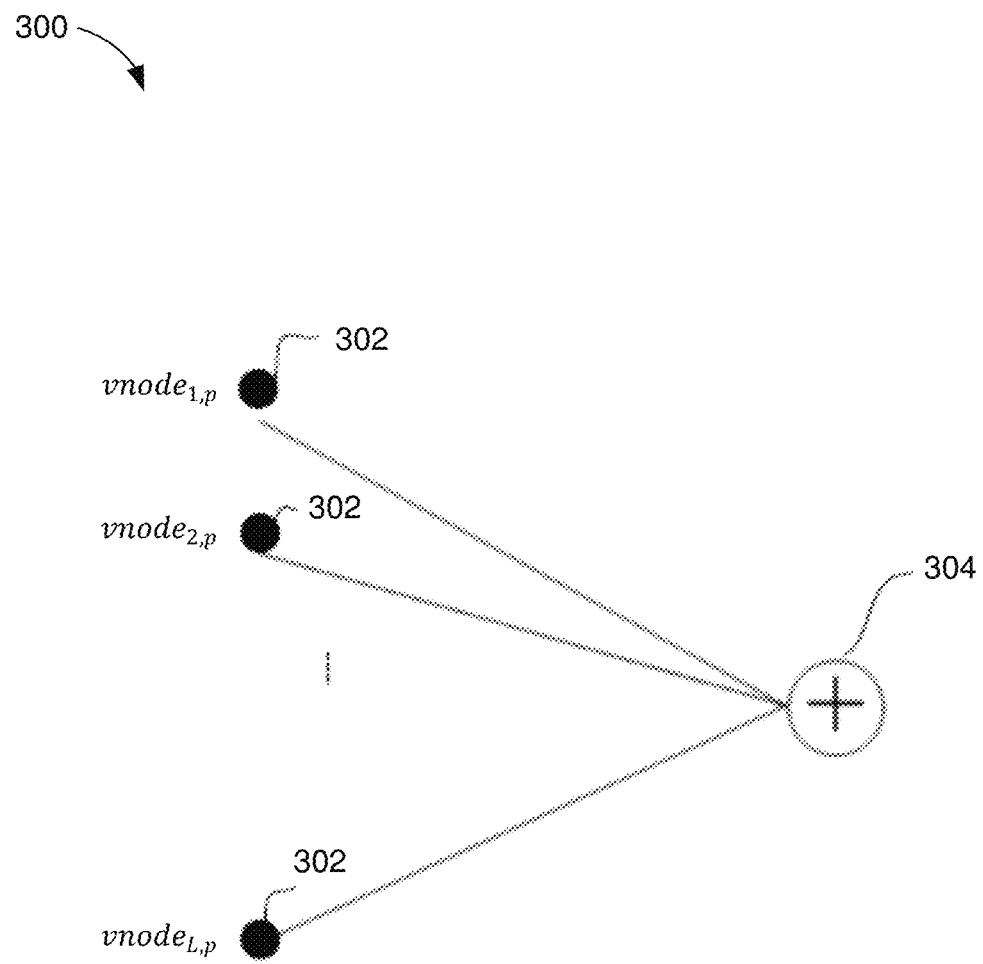
FIG. 3 shows an example bipartite graph representing a row of a parity-check matrix, in accordance with some embodiments.

FIG. 3 shows an example bipartite graph 300 representing a row of a parity-check matrix, in accordance with some embodiments. The bipartite graph 300 (which may also be referred to as a Tanner graph) includes a set of variable nodes 302 ($vnode_{1,p}$-$vnode_{L,p}$) and a check node 304. The "edges" (e.g., lines) in the bipartite graph 300 connect the variable nodes 302 to the check node 304. More specifically, $vnode_{l,p}$ denotes the $l^{th}$ variable node 302 that participates in the $p^{th}$ row of the parity-check matrix, where L is the total number of non-zero bits in the $p^{th}$ row of the parity-check matrix. With reference for example to FIG. 2A, there are 11 bits (or columns) that participate in the parity-check operation associated with the first row (or layer) of the parity-check matrix 200A, thus L=11.

An LDPC decoder may decode a received codeword (c) by exchanging messages within the bipartite graph 300, along the edges, and updating these messages by performing computations at the nodes based on the incoming messages. For example, each variable node 302 in the graph 300 may initially be provided with a "soft bit" (e.g., representing the received bit of the codeword) that indicates an estimate of the associated bit's value as determined by observations from the communications channel. Using these soft bits, the LDPC decoder may update messages by iteratively reading them (or some portion thereof) from memory and writing an updated message (or some portion thereof) back to memory. The update operations are typically based on the parity check constraints of the corresponding LDPC code. For example, the LDPC decoder may update the soft bits associated with the codeword c to satisfy the equation:

$$h_p c^T = 0,$$

where $h_p$ is the $p^{th}$ row of the parity-check matrix.

FIG. 4A shows an example layered decoding operation 400A, in accordance with some embodiments. As shown in FIG. 4A, each $b^{th}$ layer of a corresponding parity-check matrix (H) contains the rows P·(b−1)+1 to P·b, thus each $b^{th}$ layer has a row weight $L_b$. In the layered decoding operation 400A, P denotes the size (e.g., number of rows) of a circulant submatrix in the parity-check matrix H, and B denotes the number of layers in the parity-check matrix H (e.g., B=(N−K)/P). Furthermore, $v_{l,p}^b$ denotes the log-likelihood ratio (LLR) of the $l^{th}$ variable node $\text{vnode}_{l,p}^b$ in the $p^{th}$ row of the $b^{th}$ layer of the parity-check matrix, and $V_{l,p}^b$ denotes the set of LLRs for all of the variable nodes $\text{vnode}_{l,p}^b$ that participate in the $p^{th}$ row of the $b^{th}$ layer of the parity-check matrix excluding $v_{l,p}^b$ (e.g., $V_{l,p}^b = V_{l,p}^b / v_{l,p}^b$). The messages exchanged between check nodes and variable nodes are represented as "updates," where $\text{upd\_vnode}_{l,p}^b$ denotes the update to the variable node $\text{vnode}_{l,p}^b$ in the $p^{th}$ row of the $b^{th}$ layer of the parity-check matrix.

In some embodiments, a variable update rule of the layered decoding operation 400A may use a belief propagation algorithm. A belief propagation algorithm may include, for example, a sum-product algorithm, a min-sum algorithm, a scaled min-sum algorithm, a variable scaled min-sum algorithm, and any other suitable belief propagation algorithms. The examples described herein use a scaled min-sum algorithm for illustrative purposes only. In some embodiments, the variable node update rule may perform lines 2 through 12 of the layered decoding operation 400A for each $b^{th}$ layer by processing the P consecutive rows of that layer.

Figure 4B:
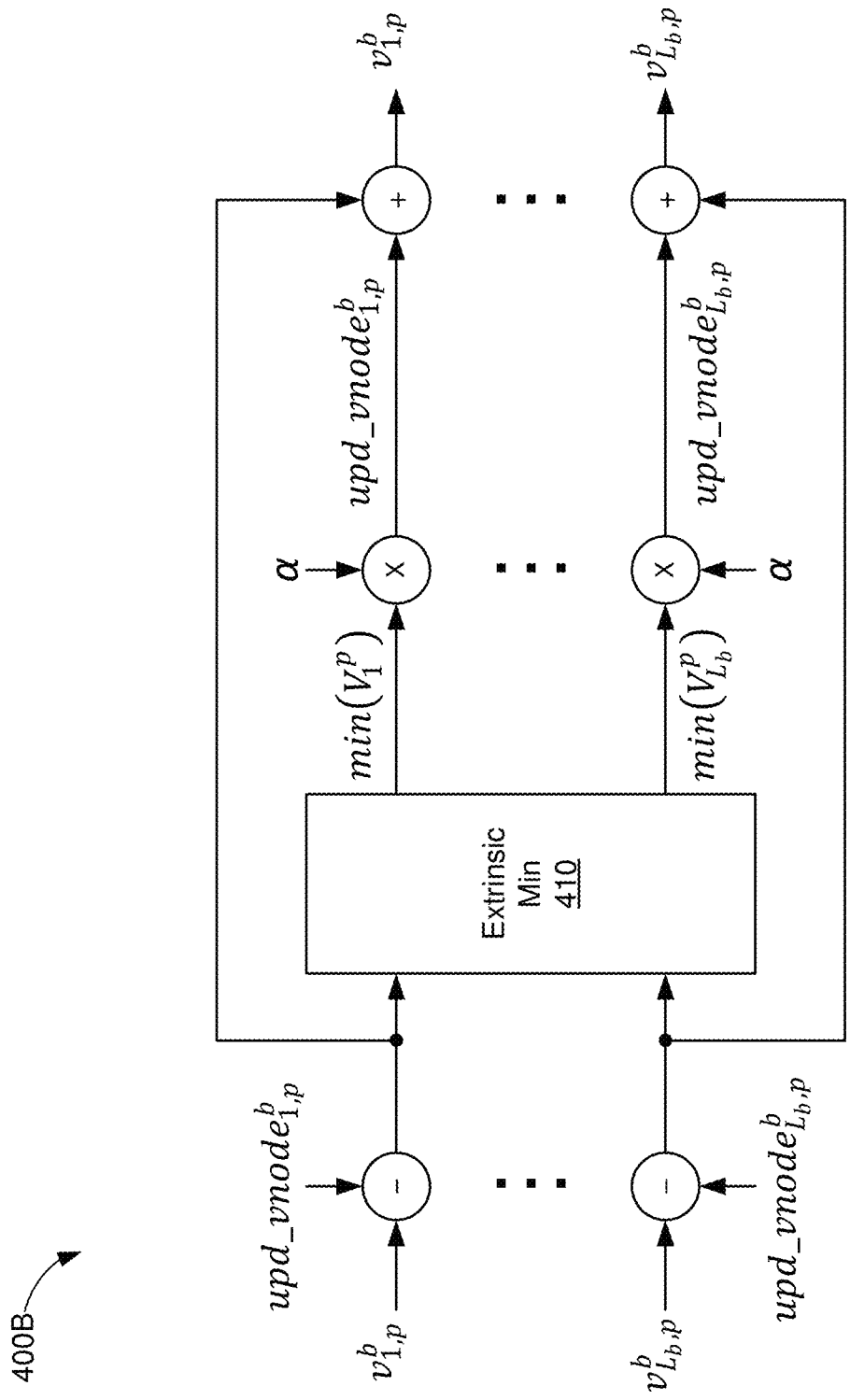
FIG. 4B is a block diagram of an example row processing unit for an LDPC decoder, in accordance with some embodiments.

FIG. 4B is a block diagram of an example row processing unit 400B for an LDPC decoder, in accordance with some embodiments. With reference for example to FIG. 4A, the row processing unit 400B may be configured to process and/or execute lines 3 through 11 of the layered decoding operation 400A for the $p^{th}$ row of the $b^{th}$ layer of a corresponding parity-check matrix. The row processing unit 400B receives, as its inputs, LLR values $v_{1,p}^b$ through $v_{L_b,p}^b$ (for $\text{vnode}_{1,p}^b$ through $\text{vnode}_{L_b,p}^b$, respectively). In some aspects, the LLR values $v_{l,p}^b$ may be obtained from a previous update (e.g., from another layer). Thus, the row processing unit 400B may first subtract the corresponding check node messages $\text{upd\_vnode}_{1,p}^b$ through $\text{upd\_vnode}_{L_b,p}^b$ from the LLR values $v_{1,p}^b$ through $v_{L_b,p}^b$, respectively (e.g., as described in line 4 of the layered decoding operation 400A).

An extrinsic minimum generator 410 may compute the extrinsic minimum values of the LLRs $v_{l,p}^b$ for each variable node index l, from 1 to $L_b$ (e.g., by computing $\min(|V_l^p|)$ $\Pi \text{sign}(V_l^p)$ as described in line 7 of the layered decoding operation 400A). In the example of FIG. 4B, a scalar (α) is applied to the extrinsic minimum values $\min(V_1^p)$ through $\min(V_{L_b}^p)$ to generate scaled extrinsic minimum values, which correspond to updates $\text{upd\_vnode}_{1,p}^b$ through $\text{upd\_vnode}_{L_b,p}^b$ for the current layer being processed. The updates $\text{upd\_vnode}_{1,p}^b$ through $\text{upd\_vnode}_{L_b,p}^b$ are added to the LLR values $v_{1,p}^b$ through $v_{L_b,p}^b$, respectively, to produce updated LLR values $v_{l,p}^b$ (e.g., as described in line 10 of the layered decoding operation 400A) at the output of the row processing unit 400B. The updated LLR values $v_{1,p}^b$ through $v_{L_b,p}^b$ may then be stored in memory (not shown for simplicity), and may be used in a subsequent update of the layered decoding operation 400A.

The example row processing unit 400B may be scaled to simultaneously process P consecutive rows of a given layer of the parity-check matrix, for example, by operating a number (P) of the row processing units 400B in parallel. For example, a decoder architecture with 128 processors (e.g., M=128) may be able to process one circulant having a size of up to P=128 per cycle. More specifically, it may take the decoder $L_b$ cycles to complete a single layer if P=128. However, if P≤64, the decoder may process up to 2 circulants in parallel per cycle. Further, if P≤32, the decoder may process up to 4 circulants in parallel per cycle. Thus, the number of parallel operations that may be performed by the decoder increases as the size of the circulant submatrix decreases, allowing a layer to be completed in less than $L_b$ cycles.

Although an LDPC decoder may be capable of processing multiple rows of a circulant submatrix in a single cycle, the number of cycles needed to process an entire layer of the base matrix (which may include multiple submatrices) may depend on the number (M) of processors in the decoder and/or the size (P) of circulant submatrices in the parity-check matrix. For example, an LDPC decoder with 12 processors (e.g., M=12) may be capable of processing up to 12 orthogonal vectors (e.g., rows of a circulant submatrix) concurrently or in parallel. Thus, the LDPC decoder may operate with 100% efficiency when processing circulant submatrices of size P=12. In other words, because there are no dependencies between the rows of a circulant submatrix, the LDPC decoder may utilize all 12 processors to process all 12 rows of the circulant submatrix concurrently (e.g., in a single cycle). However, when processing circulant submatrices of size P=9, the LDPC decoder may operate at only 75% efficiency since the LDPC decoder may be unable to pack more than one circulant submatrix of size P=9 into the 12 available processors in each processing cycle. In other words, 3 of the processors in the LDPC decoder will remain unutilized. Accordingly, aspects of the present disclosure recognize that the LDPC decoder may operate with suboptimal efficiency when M is not an integer multiple of P.

Figure 5A:
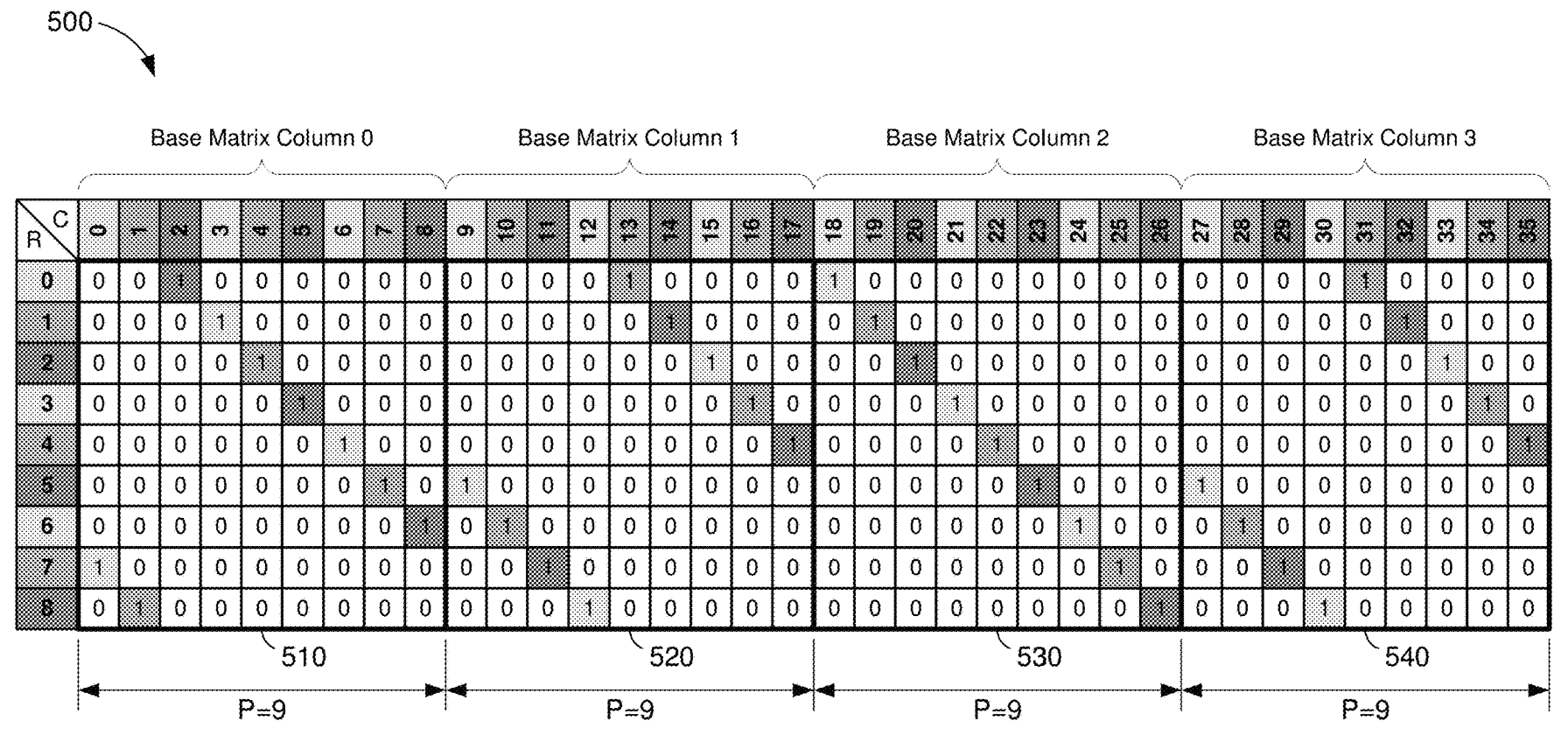

FIG. 5A shows an example parity-check matrix 500 for an LDPC code, in accordance with some embodiments. In some embodiments, the parity-check matrix 500 may be associated with a QC LDPC code. In the example of FIG. 5A, only the first layer (e.g., rows 0-8) of the parity-check matrix 500 is shown for simplicity. However, in actual implementations, the parity-check matrix 500 may include more layers than those depicted in FIG. 5A. The first layer of the parity-check matrix 500 is shown to include four circulant submatrices 510-540 of size P=9, each having a circulant weight equal to 1. More specifically, submatrix 510 comprises columns 0-8 of the parity-check matrix 500 (e.g., column 0 of the base matrix); submatrix 520 comprises columns 9-17 of the parity-check matrix 500 (e.g., column 1 of the base matrix); and submatrix 530 comprises columns 18-26 of the parity-check matrix 500 (e.g., column 2 of the base matrix); and submatrix 540 comprises columns 27-35 of the parity-check matrix 500 (e.g., column 3 of the base matrix). As described above with respect to FIGS. 4A and 4B, the rows of each circulant submatrix are orthogonal to one another (e.g., there are no dependencies between the rows) and can therefore be processed in parallel by an LDPC decoder having at least 9 row processing units. The circulant submatrices of the parity-check matrix 500 are summarized below in Table 1.

TABLE 1

| Layer | Base Matrix Column | Rotation |
|---|---|---|
| 0 | 0 | 2 |
| 0 | 1 | 4 |
| 0 | 2 | 0 |
| 0 | 3 | 4 |

Figure 5B:
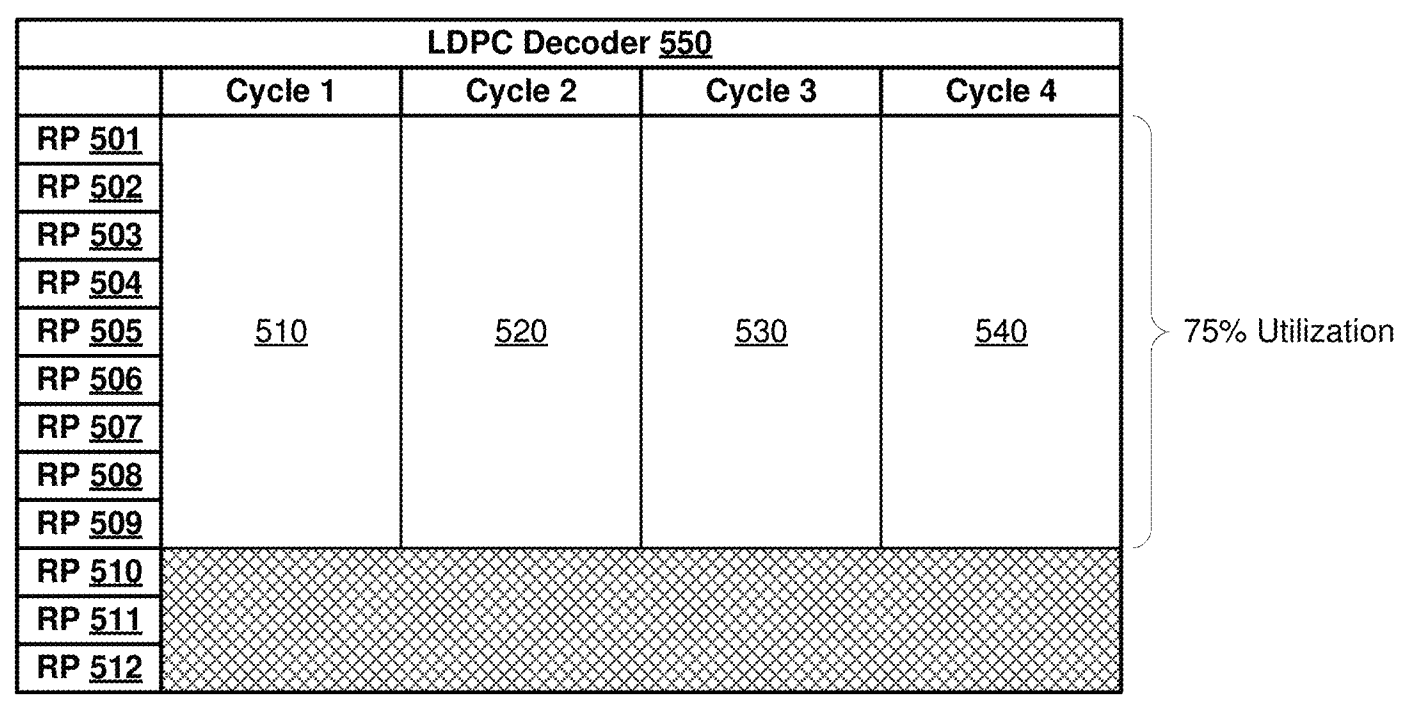

FIG. 5B shows an example LDPC decoder 550, in accordance with some embodiments. The LDPC decoder 550 may be configured to perform LDPC decoding on an LDPC codeword using a parity-check matrix. In the example of FIG. 5B, the LDPC decoder 550 may be configured to implement the parity-check matrix 500 of FIG. 5A. The LDPC decoder 550 includes a plurality of row processors (RP) 501-512. In the example of FIG. 5B, the LDPC decoder 550 is shown to include twelve row processors 501-512 (e.g., M=12). However, in other embodiments, the LDPC decoder 550 may include fewer or more processors than those depicted in FIG. 5B. Each of the row processors 501-512 may be an embodiment of the row processing unit 400B of FIG. 4B. Thus, each of the row processors 501-512 may operate on a different row of the parity-check matrix 500. As described with respect to FIG. 4B, the row processors 501-512 may operate in parallel to process up to 12 orthogonal rows of the parity-check matrix 500 at substantially the same time. Since there are no dependencies among the rows of a circulant matrix (or submatrix), the LDPC decoder 550 may process up to 12 rows of a circulant matrix in a single processing cycle.

With reference for example to FIG. 5A, the LDPC decoder 550 may pack each row of the first submatrix 510 into a respective one of the row processors 501-512. In the example of FIG. 5B, the first nine row processors 501-509 are used to decode the first submatrix 510. However, in actual implementations, any of the available processors 501-512 may be used to perform the decoding. As shown in FIG. 5B, three of the row processors 510-512 are not utilized in the processing of the first submatrix 510. Because the size of each remaining submatrix is greater than the number of remaining processors available (e.g., P>3), the LDPC decoder 550 may not be able to pack an additional submatrix into the first processing cycle (cycle 1). Thus, the LDPC decoder 550 may process only the first submatrix 510 in the first processing cycle. The LDPC decoder 550 may subsequently process the second submatrix 520 during the second processing cycle (cycle 2), the third submatrix 530 during the third processing cycle (cycle 3), and the fourth submatrix 540 during the fourth processing cycle (cycle 4). As a result, the LDPC decoder 550 may require four processing cycles to complete processing of the parity-check matrix 500.

As shown in FIG. 5B, three of the row processors 510-512 remain unutilized when processing the parity-check matrix 500 of FIG. 5A. In other words, the LDPC decoder 550 operates at 75% efficiency when implementing a parity-check matrix having submatrices of size P=9. Aspects of the present disclosure recognize that the size of the submatrices affects the efficiency of an LDPC decoder having a given number (M) of row processors. For example, at least one of the row processors will remain unutilized when M is a non-integer multiple of P. The present embodiments may improve the efficiency of LDPC decoding by modifying the parity-check matrix associated with a QC LDPC code to produce submatrices that are better suited for the hardware resources of the LDPC decoder. More specifically, the modified parity-check matrix may be generated by reordering the columns and/or rows of the original parity-check matrix. In some embodiments, the modified parity-check matrix may include submatrices that are smaller in size than the submatrices of the original parity-check matrix. For example, the size (P') of the modified submatrices may be configured such that P is an integer (f) multiple of P'. In some embodiments, the size of the modified submatrices may be optimized for the number of processors in the LDPC decoder. For example, 100% LDPC decoding efficiency may be achieved when M is an integer multiple of P'.

In some embodiments, the submatrices of the original parity-check matrix may be decomposed or otherwise reduced to a plurality of smaller submatrices. More specifically, the original circulant submatrices may be partitioned such that each new circulant submatrix retains its quasi-cyclic characteristics. In some embodiments, the modifications to the original parity-check matrix may include a column permutation and a row permutation. The row permutation groups together the check nodes each new submatrix contributes towards, and the column permutation groups together the variable nodes used by each new submatrix. The column permutation may be achieved by (multiplying the parity-check matrix by a column permutation matrix ($T_{col}$), and the row permutation may be achieved by multiplying the parity-check matrix (or the resulting matrix from the column permutation) by a row permutation matrix ($T_{row}$). The column permutations may span the total number of columns (N) of the parity-check matrix. However, the row permutations may be limited to the number of rows (M) within a single layer of the parity-check matrix.

An example column permutation for a given reduction factor (f) may be achieved by multiplying the parity-check matrix (H) by an N×N column permutation matrix $T_{col}$, where $T_{col}$ is defined as:
  for r=0 to N−1
  for c=0 to N−1
   if r==floor(c/(N/f))+f*mod(c,(N/f))
    Tcol(r,c)=1
   else
    Tcol(r,c)=0
   end
  end
  end An example row permutation for a given reduction factor f may be achieved by multiplying the parity-check matrix H, having an original submatrix size (P), by an M×M row permutation matrix $T_{row}$, where $T_{row}$ is defined as:
  for r=0 to M−1
  for c=0 to M−1 layer=floor (r/P)
if r==P*layer+floor (mod (c,P)/(P/f))+f*mod (mod (c,P), (P/f))
    Trow(r,c)=1
else
    Trow(r,c)=0
end
end
end Through matrix multiplication, a new or modified parity-check matrix (H') may be derived by applying the column permutation matrix $T_{col}$ and the row permutation matrix $T_{row}$ to the original parity-check matrix H:

$$H' = T_{row} * H * T_{col} \quad (1)$$

Figure 6A:
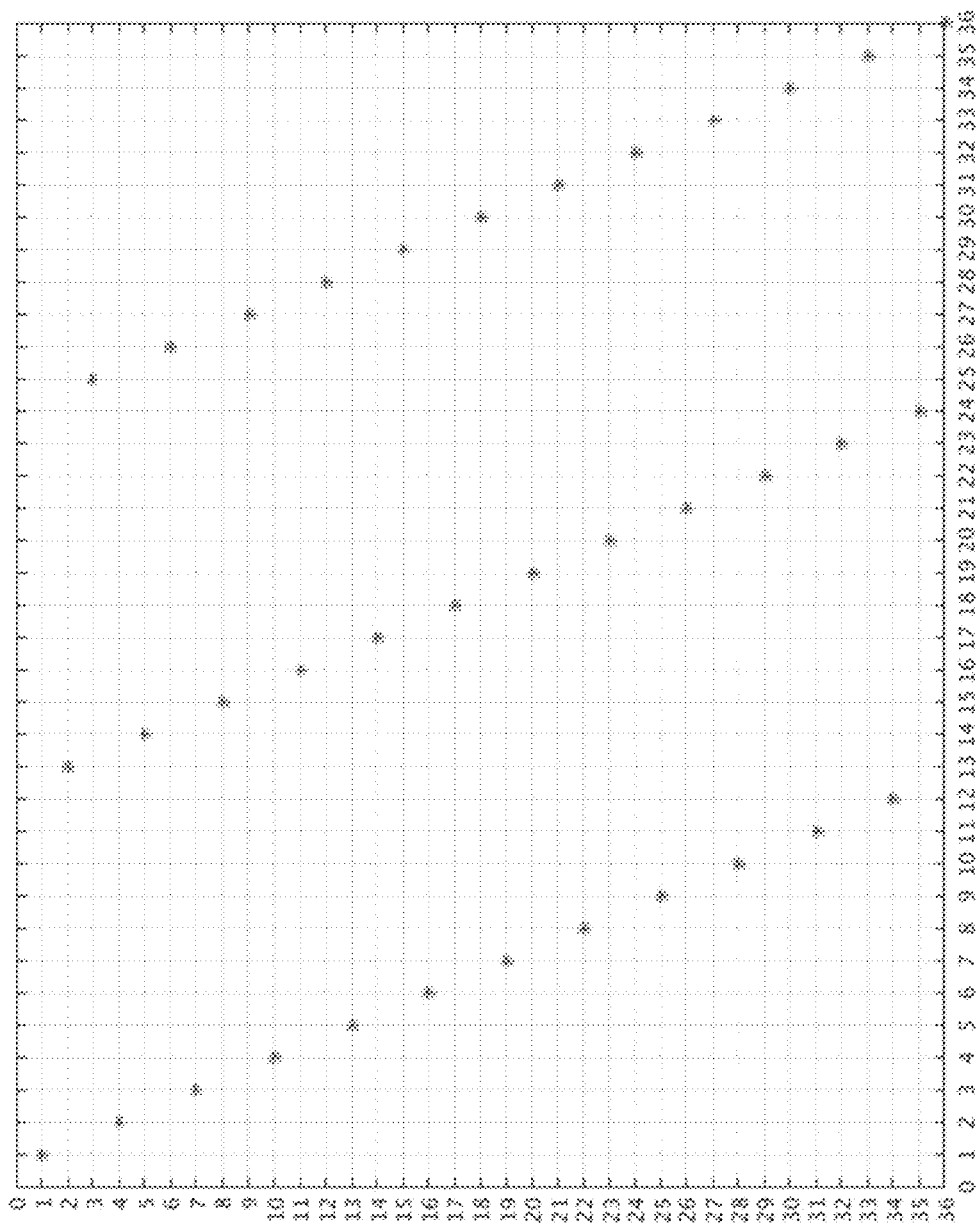
FIGS. 6A-6C show example column and row permutation matrices, in accordance with some embodiments.

FIG. 6A shows an example column permutation matrix 610, in accordance with some embodiments. The column permutation matrix 610 may be an example implementation of the pseudocode defined above for an N×N column permutation matrix $T_{col}$, where N=36, f=3, and P=9. The intersection of each row (i) and column (j) represents a "1" or "0" value in the column permutation matrix 610. In the example of FIG. 6A, asterisks (*) denote 1's in the column permutation matrix 610, whereas 0's are left unmarked.

Figure 6B:
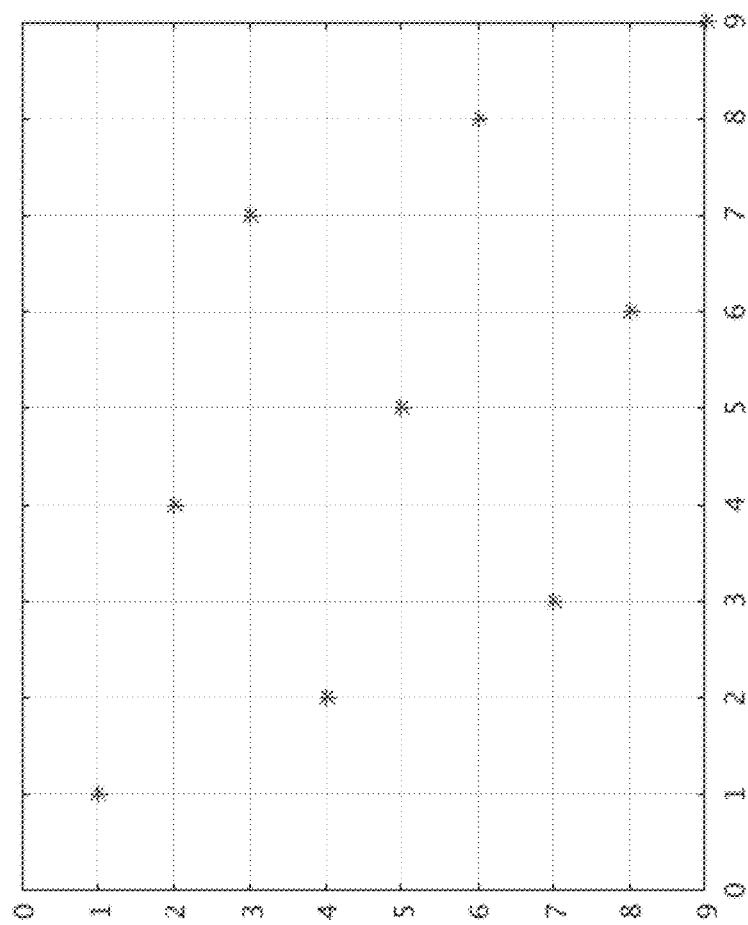

FIG. 6B shows an example row permutation matrix 620, in accordance with some embodiments. The row permutation matrix 620 may be an example implementation of the pseudocode defined above for an M×M column permutation matrix $T_{row}$, where M=9, f=3, and P=9. The intersection of each row (i) and column (j) represents a "1" or "0" value in the row permutation matrix 620. In the example of FIG. 6B, asterisks (*) denote 1's in the row permutation matrix 620, whereas 0's are left unmarked.

Figure 6C:
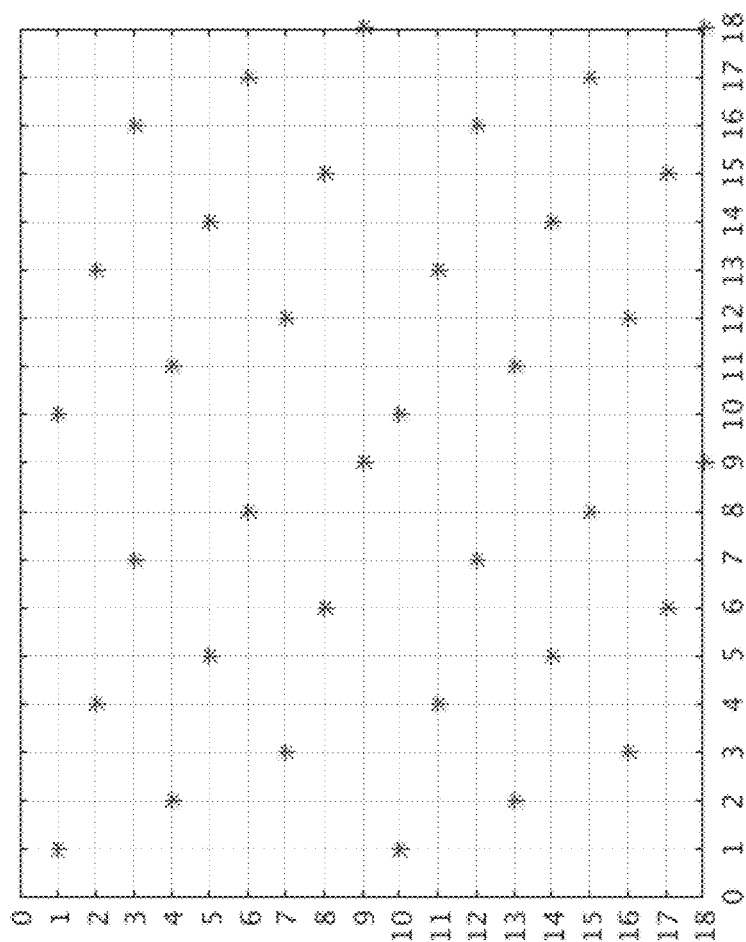

FIG. 6C shows an example row permutation matrix 630, in accordance with some embodiments. The row permutation matrix 630 may be an example implementation of the pseudocode defined above for an M×M column permutation matrix $T_{row}$, where M=18, f=3, and P=9. The intersection of each row (i) and column (j) represents a "1" or "0" value in the row permutation matrix 630. In the example of FIG. 6C, asterisks (*) denote 1's in the row permutation matrix 630, whereas 0's are left unmarked.

Figure 7A:
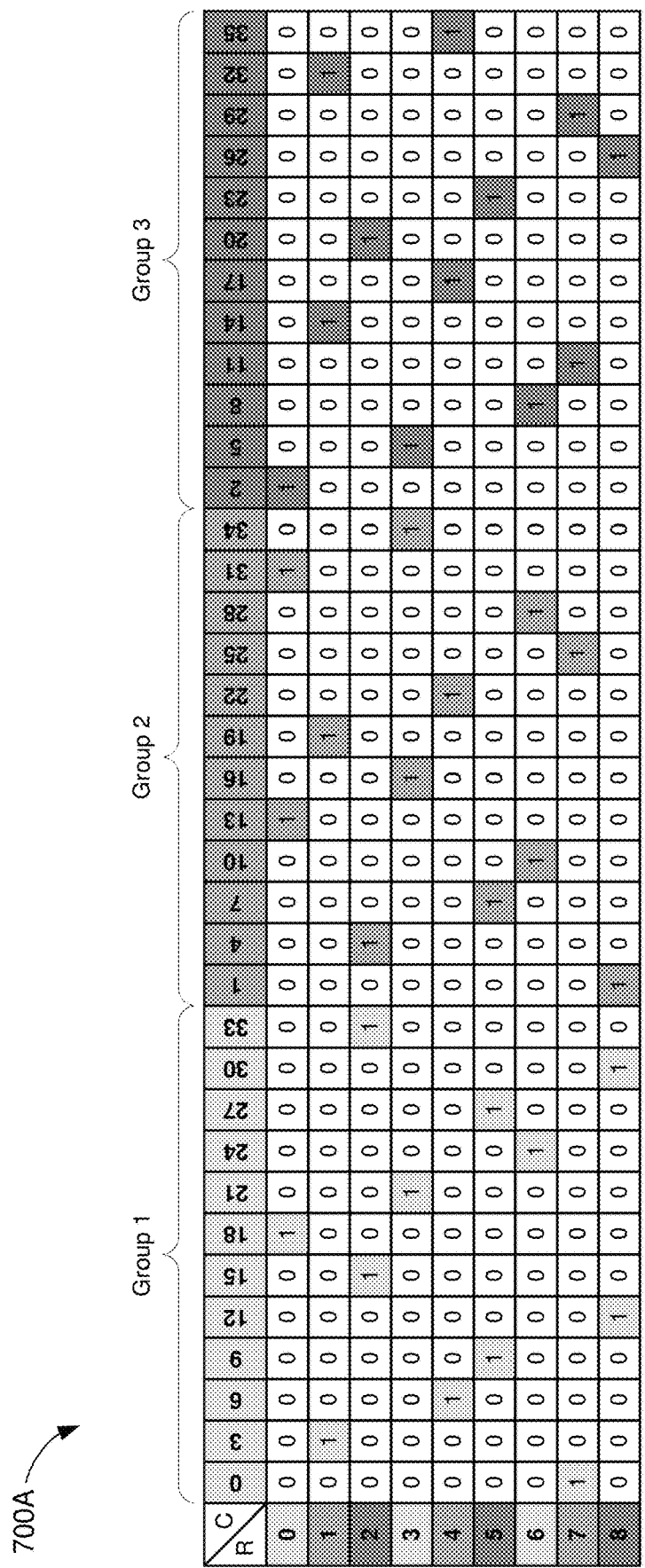
FIG. 7A shows an example column permutation of the parity-check matrix depicted in FIG. 5A.

FIG. 7A shows an example column permutation 700A of the parity-check matrix 500 depicted in FIG. 5A. In the example of FIG. 7A, the column permutation 700A may be achieved by multiplying the parity-check matrix 500 by a corresponding column permutation matrix $T_{col}$, such as defined above. As a result of the transformation, every third column of the original parity-check matrix 500 is grouped together, in ascending order, to form three new 12-column groups. For example, columns 0, 3, 6, 9, 12, 15, 18, 21, 24, 27, 30, and 33 of the original parity-check matrix 500 are reordered as the first 12 columns (e.g., Group 1) of the column permutation 700A; columns 1, 4, 7, 10, 13, 16, 19, 22, 25, 28, 31, and 34 of the original parity-check matrix 500 are reordered as the next 12 columns (e.g., Group 2) of the column permutation 700A; and columns 2, 5, 8, 11, 14, 17, 20, 23, 26, 29, 32, and 35 of the original parity-check matrix 500 are reordered as the last 12 columns (e.g., Group 3) of the column permutation 700A.

Figure 7B:
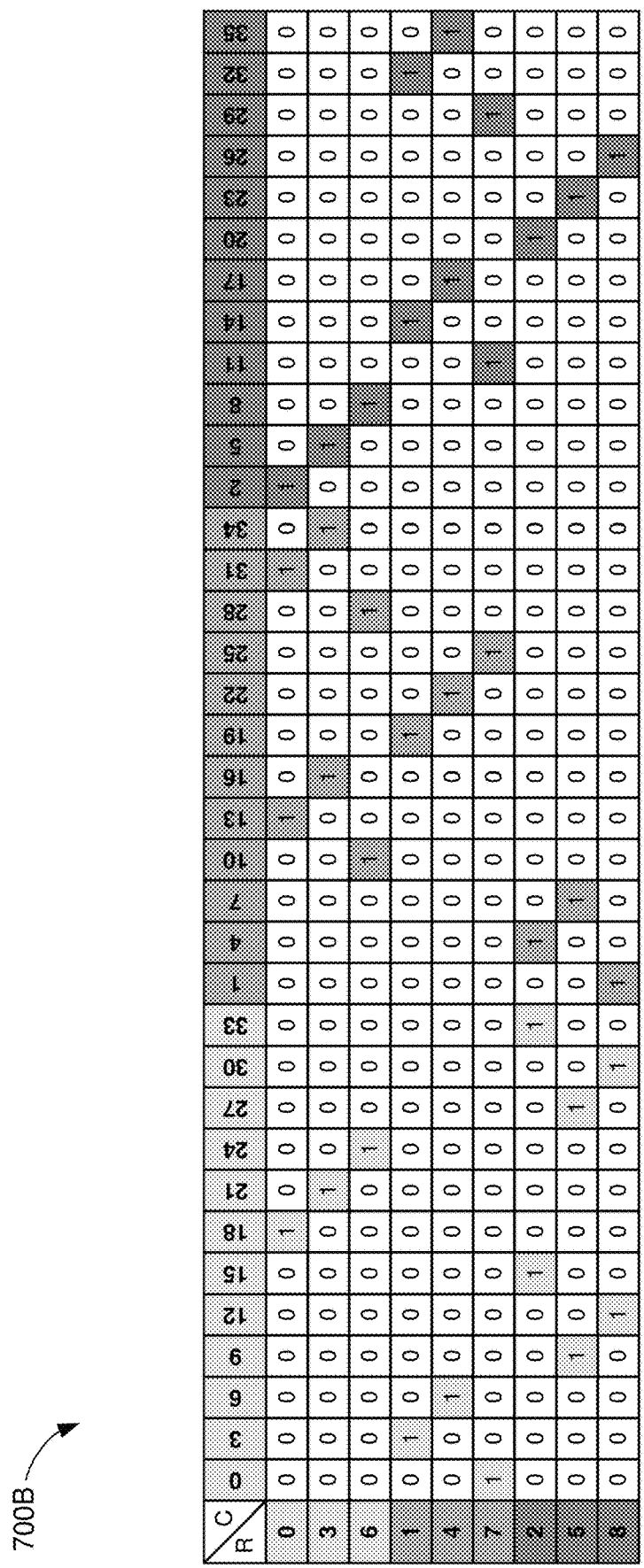
FIG. 7B shows an example row permutation of the parity-check matrix depicted in FIG. 5A.

FIG. 7B shows an example row permutation 700B of the parity-check matrix 500 depicted in FIG. 5A. In the example of FIG. 7B, the row permutation 700B may be achieved by multiplying the column permutation 700A of FIG. 7A by a corresponding row permutation matrix $T_{row}$, such as defined above. As a result of the transformation, every third row of the original parity-check matrix 500 is grouped together, in ascending order, to form three new 3-row groups. For example, rows 0, 3, and 6 of the original parity-check matrix 500 are reordered as the first 3 rows of the row permutation 700B; rows 1, 4, and 7 of the original parity-check matrix 500 are reordered as the next 3 rows of the row permutation 700B; and rows 2, 5, and 8 of the original parity-check matrix 500 are reordered as the last 3 rows of the row permutation 700B.

Figure 7C:
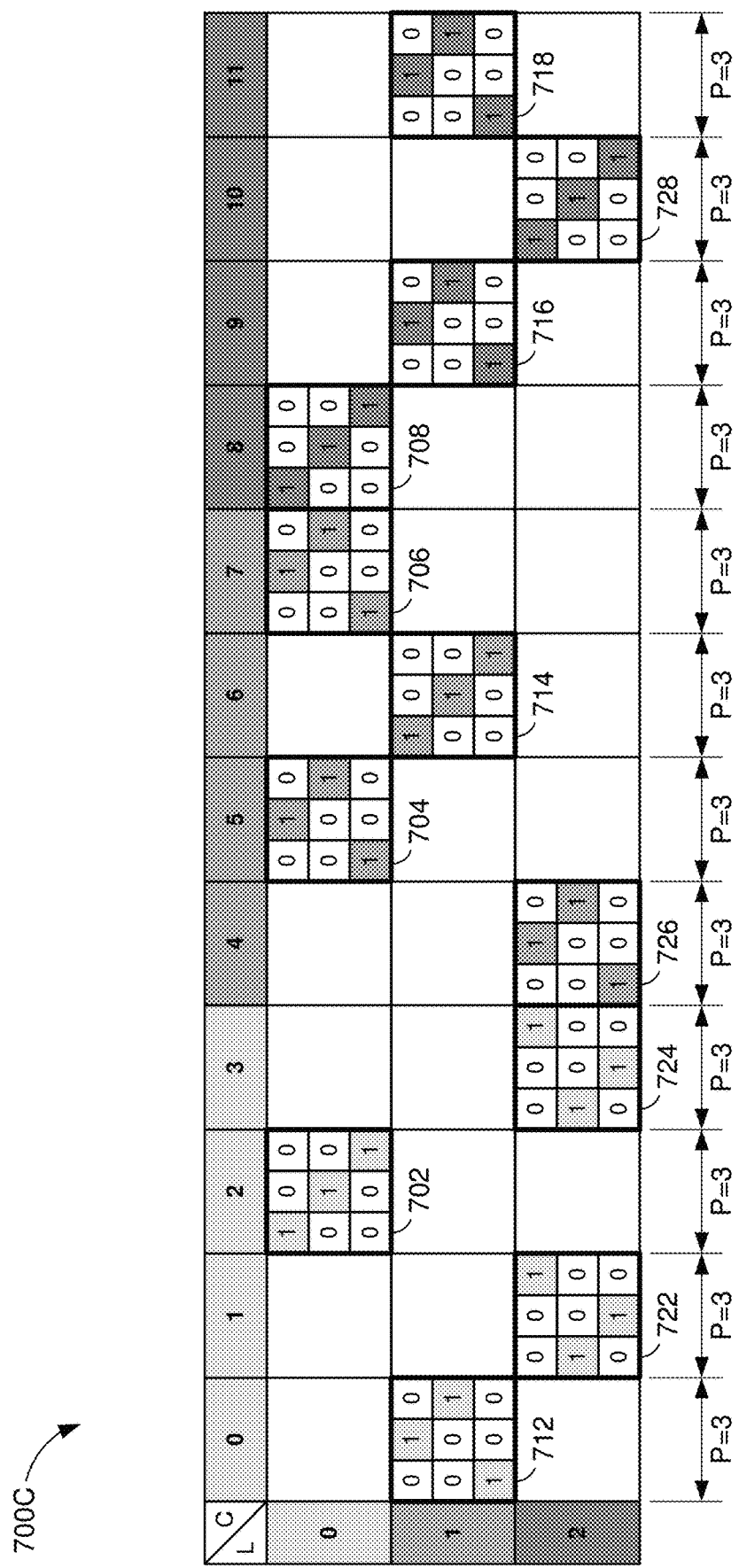
FIG. 7C shows a modified parity-check matrix, in accordance with some embodiments.

FIG. 7C shows a modified parity-check matrix 700C, in accordance with some embodiments. More specifically, the modified parity-check matrix 700C may be achieved by multiplying the parity-check matrix 500 of FIG. 5A by a corresponding column permutation matrix $T_{col}$ and a corresponding row permutation matrix $T_{row}$, such as described with respect to FIGS. 7A and 7B. In the example of FIG. 7C, the modified parity-check matrix 700C is depicted as a base matrix comprising 3 layers (e.g., layers 0-2) and 12 columns (e.g., columns 0-11). At the intersection of each layer and column is a submatrix of size P'=3. More specifically, each submatrix may correspond to an all-zero submatrix (depicted as a blank or empty square) or one of a plurality of circulant submatrices 702-728. As described above with respect to FIGS. 2A and 2B, an all-zero submatrix may be a P'×P' matrix in which all of the values are 0, and a circulant submatrix may be a P'×P' matrix in which each row and column contains a number of 1's equal to its circulant weight.

With reference for example to FIG. 5A, the original submatrices 510-540 are reduced by a factor of 3 in the modified parity-check matrix 700C. There are also no dependencies between the layers 0-3 of the modified parity-check matrix 700C. For example, layer 0 includes circulant submatrices 702, 704, 706, and 708 in columns 2, 5, 7, and 8, respectively, whereas layers 1 and 2 have all-zero submatrices in these columns; layer 1 includes circulant submatrices 712, 714, 716, and 718 in columns 0, 6, 9, and 11, respectively, whereas layers 0 and 2 have all-zero submatrices in these columns; and layer 2 includes circulant submatrices 722, 724, 726, and 728 in columns 1, 3, 4, and 10, respectively, whereas layers 0 and 1 have all-zero submatrices in these columns. Because the layers 0-2 are orthogonal to one another, multiple circulant submatrices 702-728 may be processed concurrently or in parallel. In other words, the processing of one layer does not depend on updates from another layer. The circulant submatrices of the modified parity-check matrix 700C are summarized below in Table 2.

TABLE 2

| Layer | Base Matrix Column | Rotation |
|---|---|---|
| 0 | 2 | 0 |
| 0 | 5 | 1 |
| 0 | 7 | 1 |
| 0 | 8 | 0 |
| 1 | 0 | 1 |
| 1 | 6 | 0 |
| 1 | 9 | 1 |
| 1 | 11 | 1 |
| 2 | 1 | 2 |
| 2 | 3 | 2 |
| 2 | 4 | 1 |
| 2 | 10 | 0 |

Aspects of the present disclosure recognize that various permutations of the original parity-check matrix 500 of FIG. 5A may result in modified submatrices of the same or similar size as those depicted in FIG. 7C. For example, in some embodiments, the grouping (or regrouping) of columns for each of the new submatrices may be restricted to within the span of the original column. In other words, with reference to FIG. 5A, the columns 0-8 of submatrix 510 may be reordered within the span of base matrix column 0, the columns 9-17 of submatrix 520 may be reordered within the span of base matrix column 1, the columns 18-26 of submatrix 530 may be reordered within the span of base matrix column 2, and the columns 27-35 of submatrix 540 may be reordered within the span of base matrix column 3. In some aspects, different permutations of the parity-check matrix may be better suited for different hardware configurations or constraints.

Figure 8A:
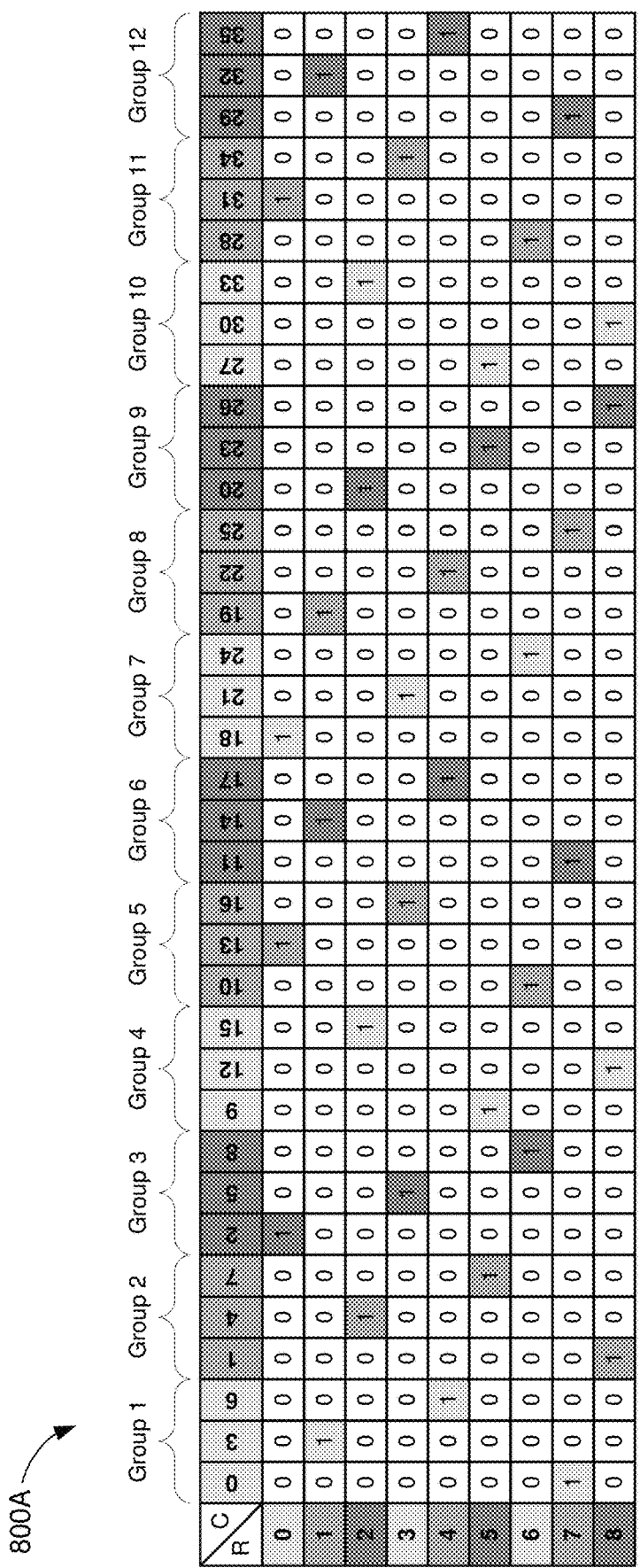
FIG. 8A shows another example column permutation of the parity-check matrix depicted in FIG. 5A.

FIG. 8A shows another example column permutation 800A of the parity-check matrix 500 depicted in FIG. 5A. In the example of FIG. 8A, the column permutation 800A may be achieved by multiplying the parity-check matrix 500 by a corresponding column permutation matrix $T_{col}$, such that every third column of the original parity-check matrix 500 is grouped together, in ascending order, to form twelve new 3-column groups. For example, columns 0, 3, and 6 of the original parity-check matrix 500 are reordered as Group 1 of the column permutation 800A; columns 1, 4, and 7 of the original parity-check matrix 500 are reordered as Group 2 of the column permutation 800A; columns 2, 5, and 8 of the original parity-check matrix 500 are reordered as Group 3 of the column permutation 800A; columns 9, 12, and 15 of the original parity-check matrix 500 are reordered as Group 4 of the column permutation 800A; columns 10, 13, and 16 of the original parity-check matrix 500 are reordered as Group 5 of the column permutation 800A; columns 11, 14, and 17 of the original parity-check matrix 500 are reordered as Group 6 of the column permutation 800A; columns 18, 21, and 24 of the original parity-check matrix 500 are reordered as Group 7 of the column permutation 800A; columns 19, 22, and 25 of the original parity-check matrix 500 are reordered as Group 8 of the column permutation 800A; columns 20, 23, and 26 of the original parity-check matrix 500 are reordered as Group 9 of the column permutation 800A; columns 27, 30, and 33 of the original parity-check matrix 500 are reordered as Group 10 of the column permutation 800A; columns 28, 31, and 34 of the original parity-check matrix 500 are reordered as Group 11 of the column permutation 800A; and columns 29, 32, and 35 of the original parity-check matrix 500 are reordered as Group 12 of the column permutation 800A.

Figure 8B:
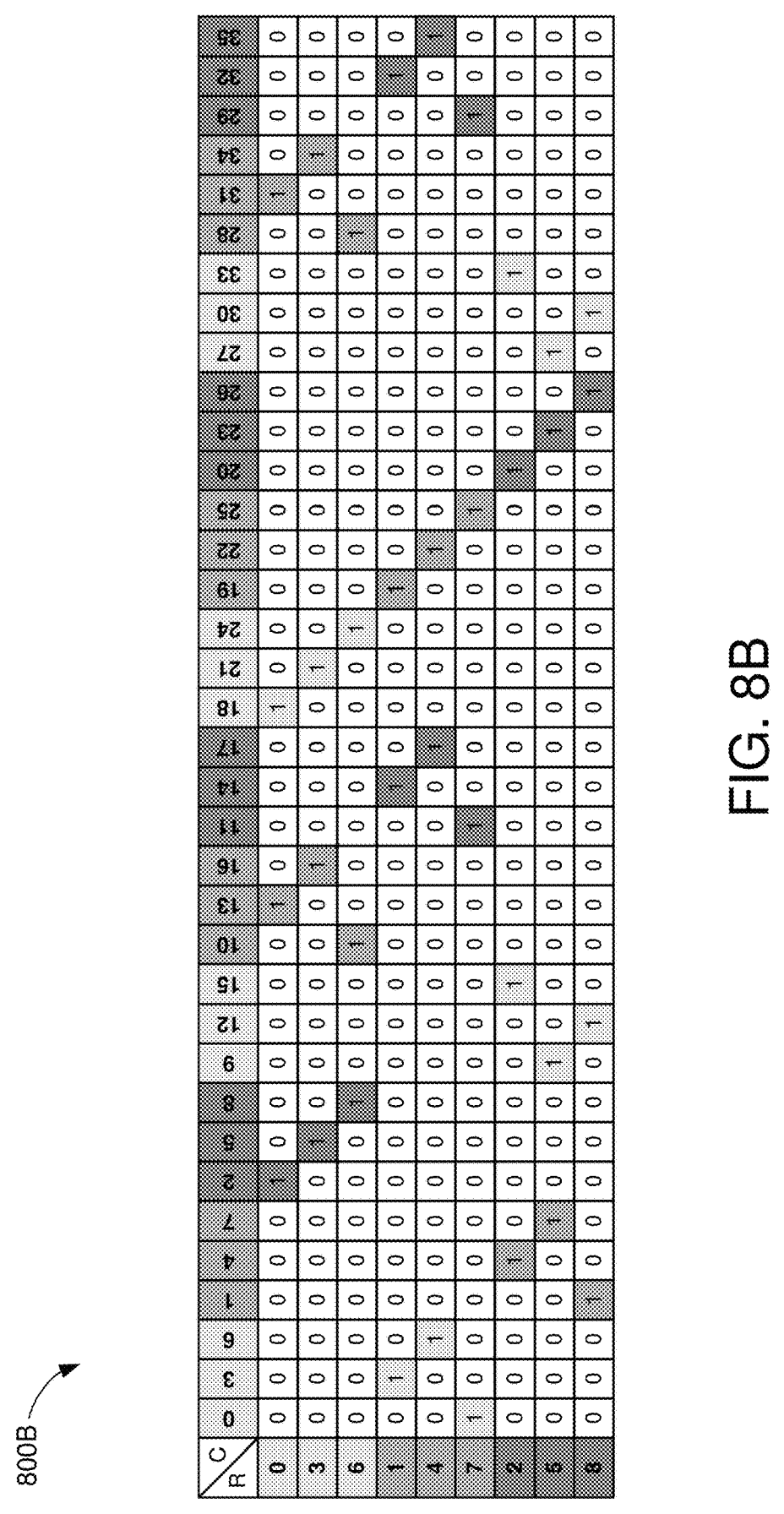

FIG. 8B shows another example row permutation 800B of the parity-check matrix 500 depicted in FIG. 5A. In the example of FIG. 8B, the row permutation 800B may be achieved by multiplying the column permutation 800A of FIG. 8A by a corresponding row permutation matrix $T_{row}$, such as defined above. As a result of the transformation, every third row of the original parity-check matrix 500 is grouped together, in ascending order, to form three new 3-row groups. For example, rows 0, 3, and 6 of the original parity-check matrix 500 are reordered as the first 3 rows of the row permutation 800B; rows 1, 4, and 7 of the original parity-check matrix 500 are reordered as the next 3 rows of the row permutation 800B; and rows 2, 5, and 8 of the original parity-check matrix 500 are reordered as the last 3 rows of the row permutation 800B.

Figure 8C:
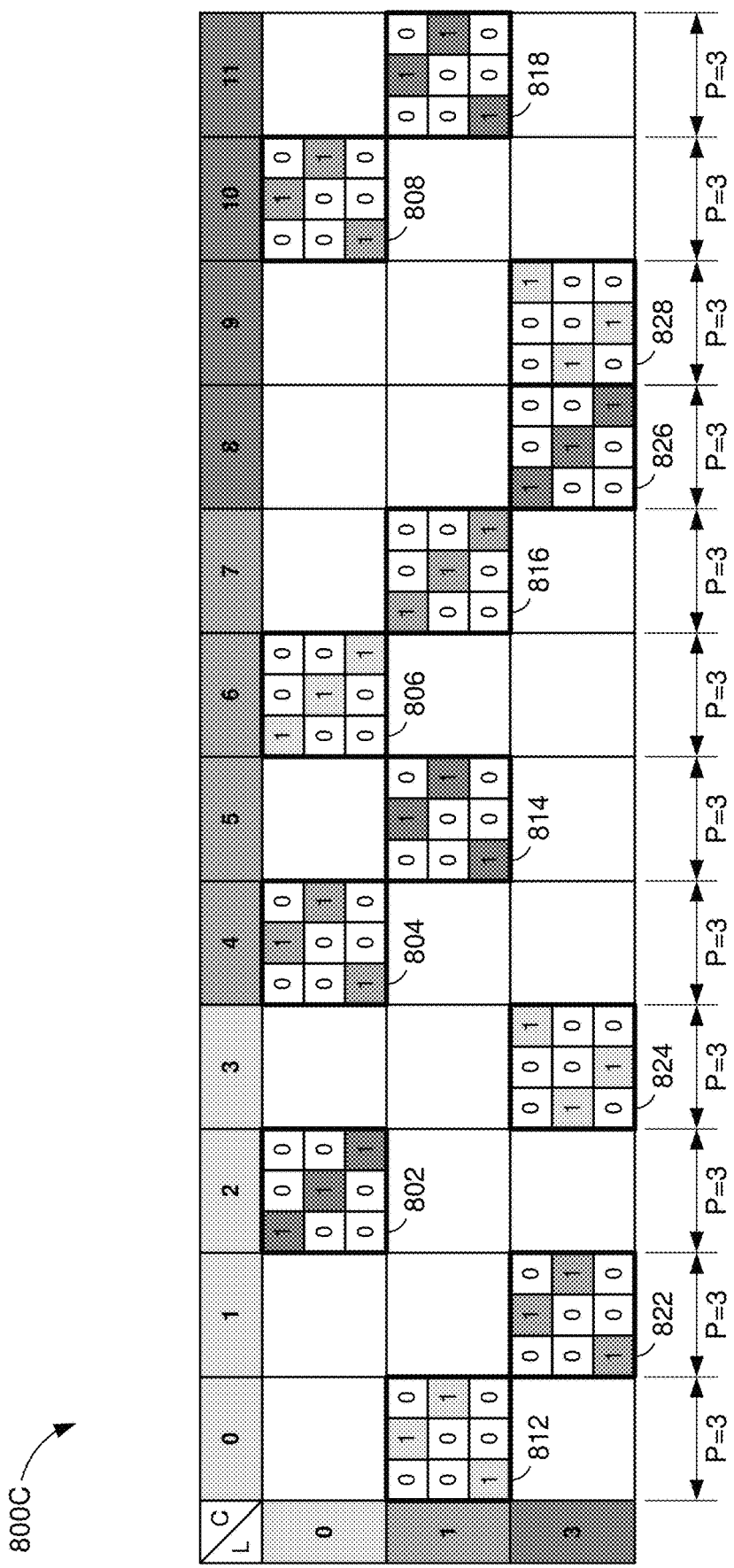
FIG. 8C shows another modified parity-check matrix, in accordance with some embodiments.

FIG. 8C shows another modified parity-check matrix 800C, in accordance with some embodiments. More specifically, the modified parity-check matrix 800C may be achieved by multiplying the parity-check matrix 500 of FIG. 5A by a corresponding column permutation matrix $T_{col}$ and a corresponding row permutation matrix $T_{row}$, such as described with respect to FIGS. 8A and 8B. In the example of FIG. 8C, the modified parity-check matrix 800C is depicted as a base matrix comprising 3 layers (e.g., layers 0-2) and 12 columns (e.g., columns 0-11). At the intersection of each layer and column is a submatrix of size P'=3. More specifically, each submatrix may correspond to an all-zero submatrix (depicted as a blank or empty square) or one of a plurality of circulant submatrices 802-828.

With reference for example to FIG. 5A, the original submatrices 510-540 are reduced in size by a factor of 3 in the modified parity-check matrix 800C. There are also no dependencies between the layers 0-3 of the modified parity-check matrix 800C. For example, layer 0 includes circulant submatrices 802, 804, 806, and 808 in columns 2, 4, 6, and 10, respectively, whereas layers 1 and 2 have all-zero submatrices in these columns; layer 1 includes circulant submatrices 812, 814, 816, and 818 in columns 0, 5, 7, and 11, respectively, whereas layers 0 and 2 have all-zero submatrices in these columns; and layer 2 includes circulant submatrices 822, 824, 826, and 828 in columns 1, 3, 8, and 8, respectively, whereas layers 0 and 1 have all-zero submatrices in these columns. Because the layers 0-2 are orthogonal to one another, multiple circulant submatrices 802-828 may be processed concurrently or in parallel. The circulant submatrices of the modified parity-check matrix 800C are summarized below in Table 3.

TABLE 3

| Layer | Base Matrix Column | Rotation |
|---|---|---|
| 0 | 2 | 0 |
| 0 | 4 | 1 |
| 0 | 6 | 0 |
| 0 | 10 | 1 |
| 1 | 0 | 1 |
| 1 | 5 | 1 |
| 1 | 7 | 0 |
| 1 | 11 | 1 |
| 2 | 1 | 1 |
| 2 | 3 | 2 |
| 2 | 8 | 0 |
| 2 | 9 | 2 |

FIG. 9 shows another example LDPC decoder 900, in accordance with some embodiments. The LDPC decoder 900 may be configured to perform LDPC decoding on an LDPC codeword using a parity-check matrix. In the example of FIG. 9, the LDPC decoder 900 is configured to implement the modified parity-check matrix 700C of FIG. 7C. The LDPC decoder 900 may be an embodiment of the LDPC decoder 550 of FIG. 5B. Thus, the LDPC decoder 900 may include a number (e.g., M=12) of row processors (RP) 901-912. Each of the row processors 901-912 may be an embodiment of the row processing unit 400B of FIG. 4B. Thus, each of the row processors 901-912 may operate on a respective row (or vector) of the modified parity-check matrix 700C. In the example of FIG. 9, the number of row processors in the LDPC decoder 900 is an integer multiple of the modified submatrix size (e.g., M=4*P'). Thus, the LDPC decoder 900 may process up to four circulant submatrices of the modified parity-check matrix 700C, concurrently, in each cycle of the LDPC decoding.

With reference for example to FIG. 7C, LDPC decoder 900 may process the circulant submatrices 702-708 of layer 0, concurrently, in the first processing cycle (cycle 1). For example, circulant submatrix 702 may be packed into row processors 901-903, circulant submatrix 704 may be packed into row processors 904-906, circulant submatrix 706 may be packed into row processors 907-909, and circulant submatrix 708 may be packed into row processors 910-912. The LDPC decoder 900 may subsequently process the circulant submatrices 712-718 of layer 1, concurrently, in the second processing cycle (cycle 2). For example, circulant submatrix 712 may be packed into row processors 901-903, submatrix 714 may be packed into row processors 904-906, circulant submatrix 716 may be packed into row processors 907-909, and submatrix 718 may be packed into row processors 910-912. Finally, the LDPC decoder 900 may process the circulant submatrices 722-728 of layer 2, concurrently, in the third processing cycle (cycle 3). For example, circulant submatrix 722 may be packed into row processors 901-903, circulant submatrix 724 may be packed into row processors 904-906, circulant submatrix 726 may be packed into row processors 907-909, and submatrix 728 may be packed into row processors 910-912.

As shown in FIG. 9, all twelve of the row processors 901-912 are utilized during each of the processing cycles. In other words, the LDPC decoder 900 operates at 100% efficiency when implementing a parity-check matrix having submatrices of size P'=3. More generally, the LDPC decoder 900 may operate at 100% efficiency when implementing any parity-check matrix having submatrices of a particular size (P'), where M is an integer multiple of P'. With reference for example to FIG. 5B, the LDPC decoder 900 may achieve a 25% reduction in execution time, or a 33% increase in efficiency, over the LDPC decoder 550.

Aspects of the present disclosure recognize that reducing the size of the submatrices may improve the overall efficiency and/or performance of the LDPC decoder even if M is a non-integer multiple of P'. For example, where P is greater than M, the LDPC decoder may require multiple processing cycles to process a single circulant submatrix of size P. However, by reducing the submatrix size such that P' is less than or equal to M, the LDPC decoder may process one or more submatrices of size P' in a single processing cycle.

FIG. 10 shows another example LDPC decoder 1000, in accordance with some embodiments. The LDPC decoder 1000 may be configured to perform LDPC decoding on an LDPC codeword using a parity-check matrix. In the example of FIG. 10, the LDPC decoder 1000 is configured to implement the modified parity-check matrix 700C of FIG. 7C. With reference for example to FIG. 9, the LDPC decoder 1000 may include fewer (e.g., M=8) row processors (RP) 1001-1008 than the LPDC decoder 900. Each of the row processors 1001-1008 may be an embodiment of the row processing unit 400B of FIG. 4B. Thus, each of the row processors 1001-1008 may operate on a respective row (or vector) of the modified parity-check matrix 700C. In the example of FIG. 10, the number of row processors in the LDPC decoder 1000 is smaller than the original submatrix size (e.g., M<P) but greater than the modified submatrix size (e.g., M>P'). Thus, the LDPC decoder 1000 may process up to two circulant submatrices of the modified parity-check matrix 700C, concurrently, in each cycle of the LDPC decoding.

With reference for example to FIG. 7C, LDPC decoder 1000 may process circulant submatrices 702 and 704, concurrently, in the first processing cycle (cycle 1). For example, circulant submatrix 702 may be packed into row processors 1001-1003 and circulant submatrix 704 may be packed into row processors 1004-1006. The LDPC decoder 1000 may then process circulant submatrices 706 and 708, concurrently, in the second processing cycle (cycle 2). For example, circulant submatrix 706 may be packed into row processors 1001-1003 and submatrix 708 may be packed into row processors 1004-1006. The LDPC decoder 1000 may then process circulant submatrices 712 and 714, concurrently, in the third processing cycle (cycle 3). For example, circulant submatrix 712 may be packed into row processors 1001-1003 and circulant submatrix 714 may be packed into row processors 1004-1006. The LDPC decoder 1000 may then process circulant submatrices 716 and 718, concurrently, in the fourth processing cycle (cycle 4). For example, circulant submatrix 716 may be packed into row processors 1001-1003 and submatrix 718 may be packed into row processors 1004-1006. The LDPC decoder 1000 may then process circulant submatrices 722 and 724, concurrently, in the fifth processing cycle (cycle 5). For example, circulant submatrix 722 may be packed into row processors 1001-1003 and circulant submatrix 724 may be packed into row processors 1004-1006. Finally, the LDPC decoder 1000 may process circulant submatrices 726 and 728, concurrently, in the sixth processing cycle (cycle 6). For example, circulant submatrix 726 may be packed into row processors 1001-1003 and submatrix 728 may be packed into row processors 1004-1006.

As shown in FIG. 10, the LDPC decoder 1000 may process two entire circulant submatrices of the modified parity-check matrix 700C per processing cycle. In contrast to the original parity-check matrix 500, the LDPC decoder 1000 would be unable to process a circulant submatrix of size P (e.g., without additional circuitry and/or modifications). However, as a result of the submatrix size reduction, P' is less than M, thereby allowing the LDPC decoder 1000 to process the modified parity-check matrix 700C using its existing hardware (e.g., without any additional circuitry and/or modifications). More generally, the LDPC decoder 1000 may operate with greater overall efficiency when implementing a modified parity-check matrix having submatrices of a reduced size (P'), where P' is less than P.

Because the modified parity-check matrix 700C is a derivative of the original parity-check matrix 500 of FIG. 5A, the present embodiments may improve the efficiency of LDPC decoding by reordering the rows and/or columns of the original parity-check matrix to produce modified (e.g., smaller) submatrices that are better suited (e.g., optimized) for the number of processors in the LDPC decoder. The modified parity-check matrix may result in submatrices of a smaller size (P') than the submatrices of the original parity-check matrix. In some implementations, the size of the submatrices may be reduced such that M is an integer multiple of P' (such as described with respect to FIG. 9). In some other implementations, the size of the submatrices may be reduced such that P' is less than or equal to M (such as described with respect to FIG. 10). As a result, the same LDPC codewords may be decoded faster and/or more efficiently using the modified parity-check matrix 700C than the original parity-check matrix 500 associated with the LDPC codewords.

Figure 11A:
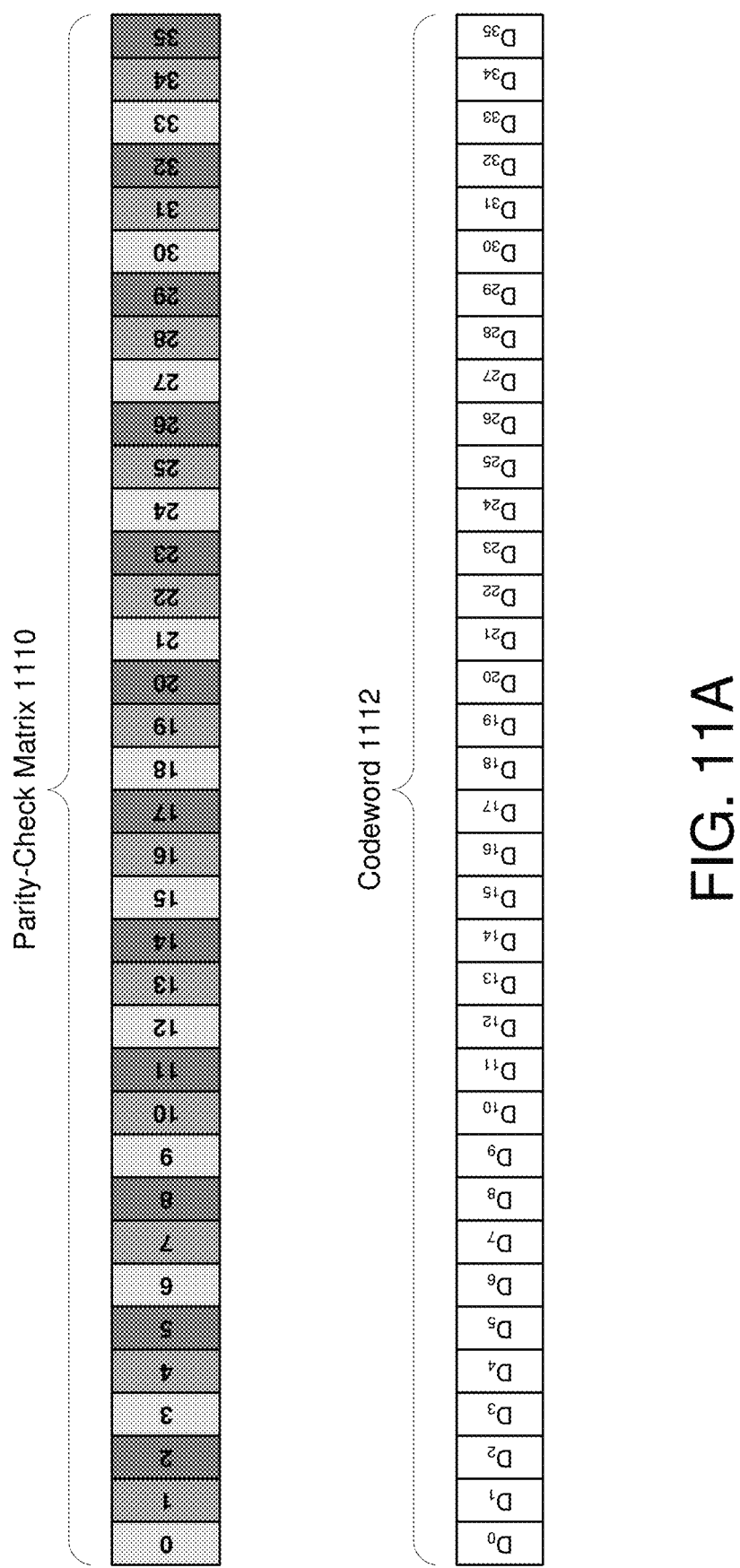
FIG. 11A shows an order of columns in an example parity-check matrix for an LDPC code and an associated codeword, in accordance with some embodiments.

In some embodiments, the sequence of data in the LDPC codeword may be reordered based, at least in part, on the modifications to the original parity-check matrix. As described above, an LDPC decoder implementing a parity-check matrix (H) may validate an LDPC codeword (c) when the following condition is satisfied: $Hc^T=0$. Accordingly, each "column" of data in the codeword may be associated with a respective column of the parity-check matrix. For example, FIG. 11A shows an order of columns in an example parity-check matrix 1110 for an LDPC code and an associated codeword 1112. The parity-check matrix 1110 may be an example embodiment of the parity-check matrix 500 of FIG. 5A. In the example of FIG. 11A, only the columns 0-35 of the parity-check matrix 1110 are shown for simplicity. The codeword 1112 may be encoded based on the LDPC code associated with the parity-check matrix 1110. Data in the codeword 1112 may be arranged in a plurality of columns $D_0$-$D_{35}$. Each column of the codeword 1112 may be associated with a respective column of the parity-check matrix 1110. For example, columns 0-35 of the parity-check matrix 1110 may correspond with columns $D_0$-$D_{35}$, respectively, of the codeword 1112.

Figure 11B:
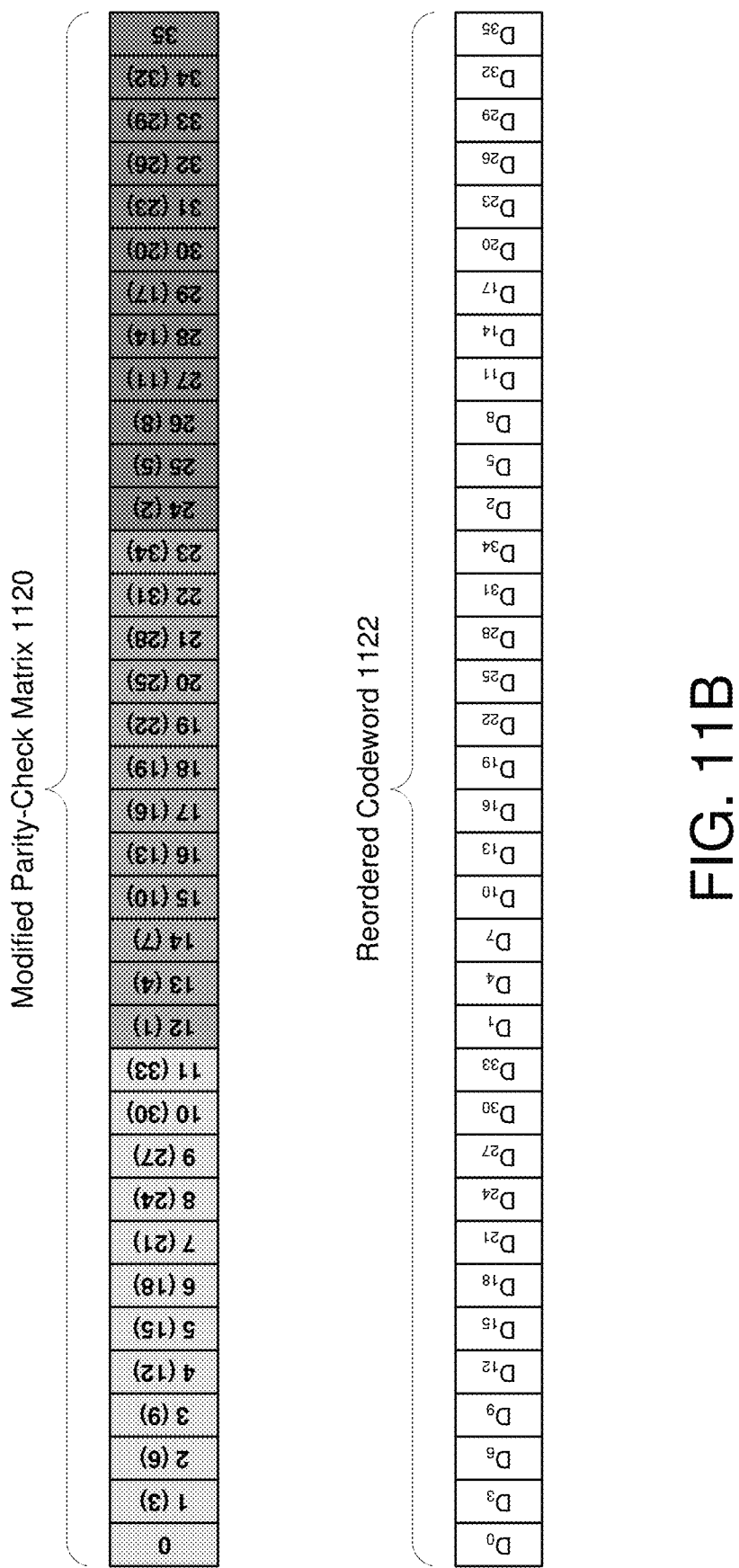
FIG. 11B shows an order of columns in a modified parity-check matrix for an LDPC code and a reordered codeword, in accordance with some embodiments.

When modifying the original parity-check matrix, similar modifications may be made to the LDPC codeword to maintain compatibility with the modified parity-check matrix. More specifically, the columns of data in the LDPC codeword may be reordered in the same (or similar) manner as the columns in the modified parity-check matrix. For example, FIG. 11B shows an order of columns in a modified parity-check matrix 1120 and a reordered codeword 1122. The modified parity-check matrix 1120 may be a modified version of the parity-check matrix 1110 of FIG. 11A. With reference for example to FIGS. 7A-7C, the modified parity-check matrix 1120 may be an example embodiment of the modified parity-check matrix 700C. As described above with respect to FIG. 7A, every third column of the original parity-check matrix 1110 is grouped together, in ascending order, to form three new 12-column groups. To maintain alignment between the columns of the reordered codeword 1122 and the columns of the modified parity-check matrix 1120, the data $D_0$-$D_{35}$ of the original codeword 1112 are reordered as $D_0$, $D_3$, $D_6$, $D_9$, $D_{12}$, $D_{15}$, $D_{18}$, $D_{21}$, $D_{24}$, $D_{27}$, $D_{30}$, $D_{33}$, $D_1$, $D_4$, $D_7$, $D_{10}$, $D_{13}$, $D_{16}$, $D_{19}$, $D_{22}$, $D_{25}$, $D_{28}$, $D_{31}$, $D_{34}$, $D_2$, $D_5$, $D_8$, $D_{11}$, $D_{14}$, $D_{17}$, $D_{20}$, $D_{23}$, $D_{26}$, $D_{29}$, $D_{32}$, and $D_{35}$ in the reordered codeword 1122.

Figure 12:
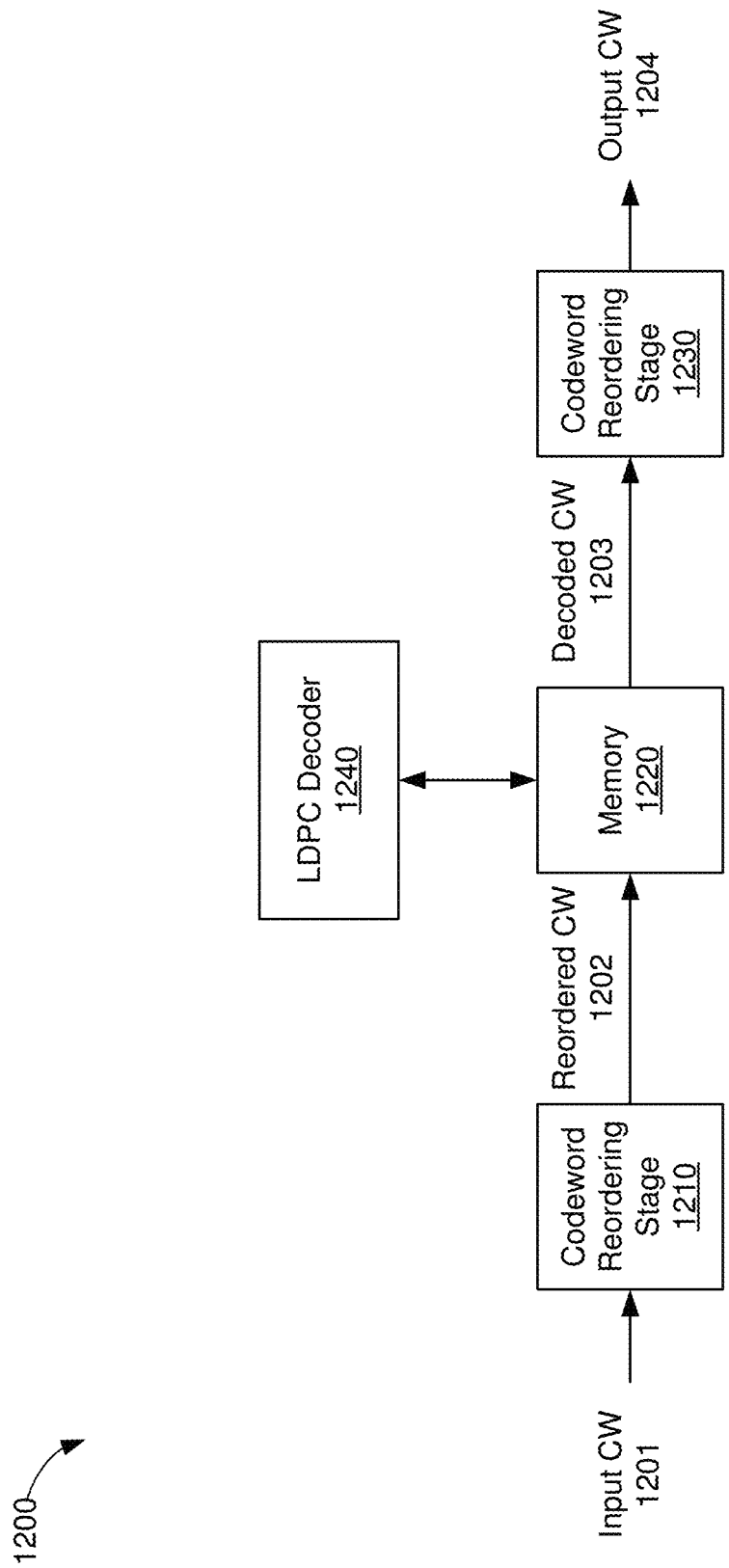
FIG. 12 shows a block diagram of an example decoding system, in accordance with some embodiments.

FIG. 12 shows a block diagram of an example decoding system 1200, in accordance with some embodiments. The decoding system 1200 includes a first codeword reordering stage 1210, a memory 1220, a second codeword reordering stage 1230, and an LDPC decoder 1240. The decoding system 1200 is configured to receive an input codeword (CW) 1201, and to generate an output codeword 1204 based on an LDPC decoding operation. For example, the decoding system 1200 may decode the input codeword 1201 in accordance with an LDPC code to detect and/or correct any errors that may have been introduced into the input codeword 1201 by a communication channel. The LDPC code used to decode the input codeword 1201 may be the same as the LDPC code used by an encoder circuit (not shown for simplicity) to encode the codeword 1201. However, in some embodiments, the LDPC decoder 1240 may be configured to implement a modified version of the parity-check matrix that would otherwise be used to decode the input codeword 1201.

The input codeword 1201 may include a sequence of data arranged in a plurality of columns. The memory 1220 may include a plurality of memory banks (not shown for simplicity) to store the columns of the input codeword 1201. In some implementations, each column of the input codeword 1201 may be assigned to one of the memory banks in the memory 1220 based, at least in part, on an order or sequence of the columns in the codeword 1201. For example, each successive column may be assigned to a different memory bank (e.g., in a round-robin fashion). The first codeword reordering stage reordering stage 1201 may be configured to reorder one or more columns of the input codeword 1201. In some embodiments, the first codeword reordering stage 1210 may reorder the columns of the input codeword 1201 based, at least in part, on any changes to the order of columns in the modified parity-check matrix (e.g., as described above with respect to FIGS. 11A and 11B). Accordingly, the first codeword reordering stage 1210 may generate a reordered codeword 1202 to be stored in memory 1220.

The LDPC decoder 1240 may be an example embodiment of the LDPC decoder 900 of FIG. 9. The LDPC decoder 1240 may be configured to perform LDPC decoding on the reordered codewords 1202 stored in memory 1220. In some implementations, only selected columns of the reordered codeword 1202 may participate in the decoding operation for each layer of the modified parity-check matrix. The selected columns may coincide with respective column positions of circulant submatrices in the modified parity-check matrix. With reference for example to FIG. 7C, the layer 0 of the modified parity-check matrix 700C includes a total of 4 circulant submatrices 702-708 located in columns 2, 5, 7, and 8 of the base matrix. Thus, when the LDPC decoder 1240 is configured to implement the modified parity-check matrix 700C, only columns $D_{18}$, $D_{21}$, $D_{24}$, $D_{10}$, $D_{13}$, $D_{16}$, $D_{28}$, $D_{31}$, $D_{34}$, $D_2$, $D_5$, and $D_8$ of the reordered codeword 1222 may participate in the first layer of decoding.

As described above with respect to FIG. 9, an LDPC decoder 1240 having 12 row processors (e.g., M=12) may process each layer of the modified parity-check matrix 700C in a single processing cycle. During each cycle, the LDPC decoder 1240 may read selected columns of the reordered codeword 1202 from memory 1220, check the values associated with the selected columns against the modified parity-check matrix 700C, update the values for the selected columns based on the parity-check operation, and write the updated values back to memory 1220 (e.g., to be used for a subsequent layer of the decoding operation).

When the layered decoding operation is completed, the second codeword reordering stage 1230 may retrieve a decoded codeword 1203 from memory 1220 and may reorder one or more columns of the decoded codeword 1203 to produce the output codeword 1204. In some embodiments, the second codeword reordering stage 1230 may be configured to "reverse" the reordering performed by the first codeword reordering stage 1210 so that the output codeword 1204 substantially tracks the input codeword 1201. More specifically, the second codeword reordering stage 1230 may read the columns of the decoded codeword 1203 in the order in which the columns were originally received at the input of the first reordering stage 1210 (e.g., based on the order of columns in the original parity-check matrix 500). With reference for example to FIG. 11B, the second codeword reordering stage 1230 may read out the columns $D_0$-$D_{35}$ of the reordered codeword 1122, in that order. As a result, the output codeword 1204 may look substantially similar to the codeword 1112 of FIG. 11A (albeit with updated values for one or more of the columns $D_0$-$D_{35}$).

The first reordering stage 1210 and/or the second reordering stage 1230 may be implemented in hardware, software, firmware, or any combination thereof. In some aspects, the first and second reordering stages 1210 and 1230 may be implemented together in an integrated logic device. In other aspects, the first and second reordering stages 1210 and 1230 may be implemented separately, as discrete but interoperable logic devices. If implemented in software, the reordering operations may be realized at least in part by a non-transitory, processor-readable storage medium storing instructions that, when executed by a processor, performs one or more of the operations described above. The term "processor," as used herein, may refer to any generalpurpose processor, conventional processor, controller, microcontroller, and/or state machine capable of executing scripts or instructions of one or more software programs stored in memory.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The reordering operations additionally, or alternatively, may be realized at least in part by a processor-readable communication medium that carries or communicates code in the form of instructions or data structures and that can be accessed, read, and/or executed by a computer or other processor.

Figure 13:
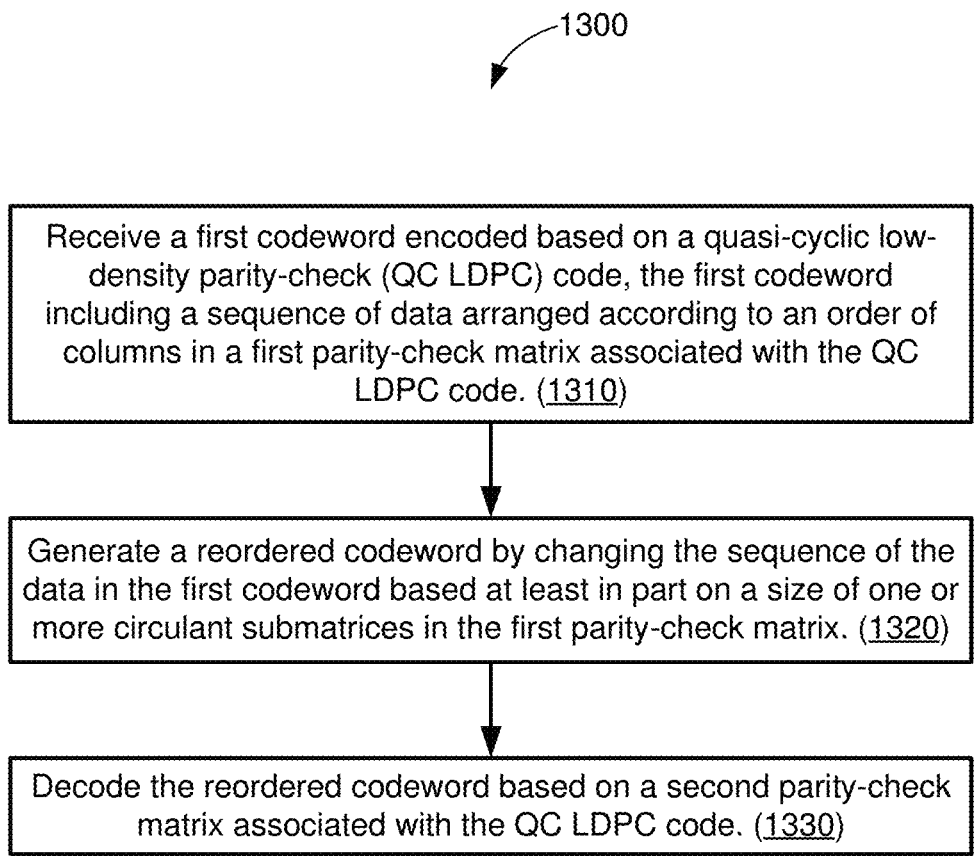
FIG. 13 is an illustrative flow chart depicting an example LDPC decoding operation, in accordance with some embodiments.

FIG. 13 is an illustrative flow chart depicting an example LDPC decoding operation 1300, in accordance with some embodiments. The example operation 1300 may be performed by any suitable decoding system such as, for example, the decoding system 1200 of FIG. 12.

The decoding system receives a first codeword encoded based on a quasi-cyclic low-density parity-check (QC LDPC) code, where the first codeword includes a sequence of data arranged according to an order of columns in a first parity-check matrix associated with the QC LDPC code (1310). The first codeword may include data arranged in a plurality of columns. As described above with respect to FIG. 11A, each column of the first codeword may be correspond with a respective column of the first parity-check matrix.

The decoding system may generate a reordered codeword by changing the sequence of the data in the first codeword based at least in part on a size of one or more circulant submatrices in the first parity-check matrix (1320). In some embodiments, the reordering of the columns in the first codeword may be based on an order of columns in a modified parity-check matrix. As described above with respect to FIG. 9, the modifications to the parity-check matrix are to improve the efficiency of an LDPC decoder with a finite number (M) of processors. The modified parity-check matrix may comprise a plurality of circulant submatrices of a reduced size (P') compared to the submatrices of the original parity-check matrix. In some embodiments, the size of the submatrices may be reduced such that M is an integer multiple (k) of P'. In some other embodiments, the size of the submatrices may be reduced such that P' is less than or equal to M. As described above with respect to FIGS. 7A-8C, the modifications may correspond to row and column permutations of the original parity-check matrix. Accordingly, the sequence of data in the first codeword may be reordered to maintain consistency or compatibility with the modified parity-check matrix.

The decoding system further decodes the reordered codeword based on a second parity-check matrix associated with the QC LDPC code (1330). The second parity-check matrix may correspond to the modified parity-check matrix having circulant submatrices of reduced size. In some embodiments, the decoding system may process k*P' circulant submatrices of the second parity-check matrix concurrently or in parallel (such as described with respect to FIG. 9). Accordingly, the decoding system of the present embodiments may decode the first codeword faster and/or more efficiently using the modified parity-check matrix than the original parity-check matrix associated with the codeword. In some other embodiments, the decoding system may process one or more circulant submatrices of the second parity-check matrix in each processing cycle without additional circuitry and/or hardware modifications (such as described with respect to FIG. 10). Accordingly, the submatrix size reduction techniques of the present embodiments may enable decoding systems to process parity-check matrices that they may not have been able to process otherwise given their hardware limitations.

Figure 14:
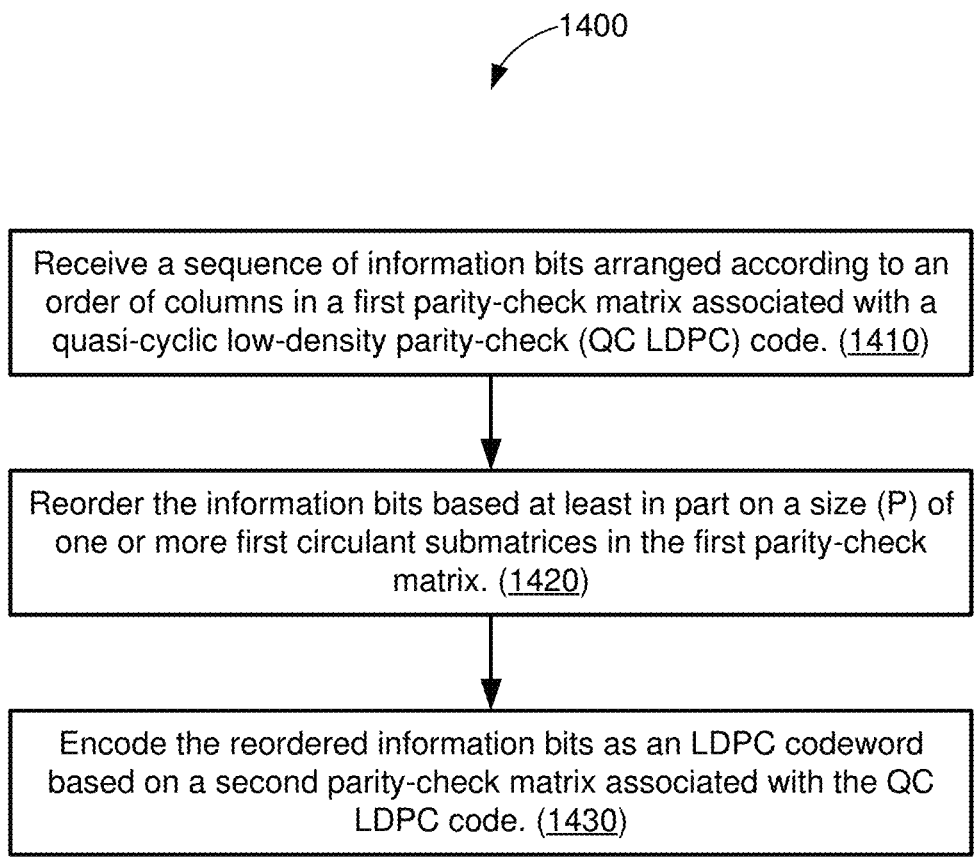
FIG. 14 is an illustrative flow chart depicting an example LDPC encoding operation 1400, in accordance with some embodiments

FIG. 14 is an illustrative flow chart depicting an example LDPC encoding operation 1400, in accordance with some embodiments. The example operation 1400 may be performed by any suitable LDPC encoding system.

The encoding system receives a sequence of information bits arranged according to an order of columns in a first parity-check matrix associated with a quasi-cyclic low-density parity-check (QC LDPC) code (1410). For example, the order of bits may be associated with an original parity-check matrix to be implemented by the encoding system.

The encoding system may reorder the information bits based at least in part on a size (P) of one or more first circulant submatrices in the first parity-check matrix (1420). In some embodiments, the reordering of the information bits may be based on an order of columns in a modified parity-check matrix. For example, the modified parity-check matrix may comprise a plurality of circulant submatrices of a reduced size (P') compared to the submatrices of the original parity-check matrix. As described above with respect to FIGS. 7A-8C, the modifications may correspond to row and column permutations of the original parity-check matrix. Accordingly, the sequence of information bits may be reordered to maintain consistency or compatibility with the modified parity-check matrix.

The encoding system further encodes the reordered information bits as an LDPC codeword based on a second parity-check matrix associated with the QC LDPC code (1430). The second parity-check matrix may correspond to the modified parity-check matrix having circulant submatrices of reduced size.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A decoding system, comprising:
   an input to receive a first codeword encoded based on a quasi-cyclic (QC) low-density parity-check (LDPC) code, the first codeword including a sequence of data arranged according to an order of columns in a first parity-check matrix associated with the QC LDPC code;
   a first codeword reordering stage to generate a reordered codeword by changing the sequence of the data in the first codeword based at least in part on a size (P) of one or more first circulant submatrices in the first parity-check matrix; and
   an LDPC decoder to generate a decoded codeword by decoding the reordered codeword based on a second parity-check matrix associated with the QC LDPC code.

2. The decoding system of claim 1, further comprising:
   a second codeword reordering stage to output the decoded codeword based on the order of the columns in the first parity-check matrix.

3. The decoding system of claim 1, wherein the LDPC decoder comprises a number (M) of row processors and is configured to process at most M orthogonal vectors concurrently.

4. The decoding system of claim 3, wherein M is not an integer multiple of P.

5. The decoding system of claim 3, wherein the second parity-check matrix comprises a plurality of second circulant submatrices of a different size (P') than the first circulant submatrices.

6. The decoding system of claim 5, wherein P is an integer multiple of P'.

7. The decoding system of claim 5, wherein P is greater than M, and wherein P' is less than or equal to M.

8. The decoding system of claim 5, wherein M is an integer (k) multiple of P', and wherein the LDPC decoder is configured to process k*P' second circulant submatrices of the second parity-check matrix concurrently.

9. The decoding system of claim 5, wherein the second circulant submatrices are generated by reordering the columns and rows of the first parity-check matrix.

10. The decoding system of claim 9, wherein the first codeword reordering stage is to change the sequence of the data in the first codeword based on the reordering of the columns of the first parity-check matrix.

11. A method, comprising:
    receiving a first codeword encoded based on a quasi-cyclic (QC) low-density parity-check (LDPC) code, the first codeword including a sequence of data arranged according to an order of columns in a first parity-check matrix associated with the QC LDPC code;
    generating a reordered codeword by changing the sequence of the data in the first codeword based at least in part on a size (P) of one or more first circulant submatrices in the first parity-check matrix; and
    decoding the reordered codeword based on a second parity-check matrix associated with the QC LDPC code.

12. The method of claim 11, further comprising:
    outputting the decoded codeword based on the order of the columns in the first parity-check matrix.

13. The method of claim 11, wherein the decoding is performed by an LDPC decoder comprising a number (M) of row processors and configured to process at most M orthogonal vectors concurrently, wherein M is not an integer multiple of P.

14. The method of claim 13, wherein the second parity-check matrix comprises a plurality of second circulant submatrices of a different size (P') than the first circulant submatrices, wherein P is an integer multiple of P'.

15. The method of claim 14, wherein P is greater than M, and wherein P' is less than or equal to M.

16. The method of claim 14, wherein M is an integer (k) multiple of P', and wherein the decoding comprises:
    processing k*P' second circulant submatrices of the second parity-check matrix concurrently.

17. The method of claim 14, wherein the generating comprises:
    generating the second circulant submatrices by reordering the columns and rows of the first parity-check matrix; and
    changing the sequence of the data in the first codeword based on the reordering of the columns of the first parity-check matrix.

18. A method, comprising:
    receiving a sequence of information bits arranged according to an order of columns in a first parity-check matrix associated with a quasi-cyclic (QC) low-density parity-check (LDPC) code;
    reordering the information bits based at least in part on a size (P) of one or more first circulant submatrices in the first parity-check matrix; and
    encoding the reordered information bits based on the QC LDPC code to form an LDPC codeword, the LDPC codeword including the sequence of information bits arranged and encoded according to the order of columns in a second parity-check matrix associated with the QC LDPC code.

19. The method of claim 18, further comprising:
    outputting the LDPC codeword based on the order of the columns in the first parity-check matrix.

20. The method of claim 18, wherein the second parity-check matrix comprises a plurality of second circulant submatrices of a different size (P') than the first circulant submatrices, wherein P is an integer multiple of P'.

* * * * *